United States Patent [19]
Ishizuka et al.

[11] Patent Number: 5,665,630
[45] Date of Patent: Sep. 9, 1997

[54] DEVICE SEPARATION STRUCTURE AND SEMICONDUCTOR DEVICE IMPROVED IN WIRING STRUCTURE

[75] Inventors: Keiji Ishizuka, Kawasaki; Yuzo Kataoka, Hiratsuka; Toshihiko Ichise, Kawasaki; Hidekazu Takahashi, Atsugi; Hayao Ohzu, Fuchu, all of Japan

[73] Assignee: Canon Kabushiki Kaisha, Tokyo, Japan

[21] Appl. No.: 341,965

[22] Filed: Nov. 16, 1994

Related U.S. Application Data

[60] Continuation of Ser. No. 996,643, Dec. 24, 1992, abandoned, which is a division of Ser. No. 707,022, May 29, 1991, Pat. No. 5,200,639.

[30] Foreign Application Priority Data

| | | | |
|---|---|---|---|
| May 31, 1990 | [JP] | Japan | 2-139623 |
| May 31, 1990 | [JP] | Japan | 2-139624 |
| Jun. 29, 1990 | [JP] | Japan | 2-169947 |

[51] Int. Cl.$^6$ .................................................. H01L 21/76
[52] U.S. Cl. ........................... 438/620; 438/675; 438/233
[58] Field of Search ............................... 437/61, 74, 203, 437/187, 194, 63; 117/104

[56] References Cited

U.S. PATENT DOCUMENTS

| | | | |
|---|---|---|---|
| 4,044,452 | 8/1977 | Abbas et al. | 29/571 |
| 4,819,052 | 4/1989 | Hutter | 357/49 |
| 4,924,019 | 5/1990 | Hui et al. | 556/187 |
| 5,151,305 | 9/1992 | Matsumoto et al. | 427/252 |
| 5,179,042 | 1/1993 | Mikoshiba et al. | 437/187 |
| 5,180,687 | 1/1993 | Mikoshiba et al. | 437/187 |
| 5,393,699 | 2/1995 | Mikoshiba et al. | 437/187 |
| 5,447,568 | 9/1995 | Hayakawa et al. | 118/715 |
| 5,476,815 | 12/1995 | Kawasumi | 437/192 |

FOREIGN PATENT DOCUMENTS

| | | | |
|---|---|---|---|
| 59-4121 | 1/1984 | Japan | 437/203 |
| 60-148147 | 8/1985 | Japan . | |
| 63-116445 | 5/1988 | Japan | H01L 21/76 |
| 63-217644 | 9/1988 | Japan | 437/203 |
| 2-185026 | 7/1990 | Japan . | |
| 2137019 | 9/1984 | United Kingdom . | |

OTHER PUBLICATIONS

Amazawa et al., 'Selective Growth of Al . . . System' International Electron Devices Meeting (1988) San Francisco CA.

Levy et al. "Characterization of LPCVD Aluminum for VLSI Processing", S. Electrochem. Soc. pp. 2176–2182 (1984).

Bhat et al., "The Growth and Characterization of AlGaAs Using Dimethyl Aluminum Hydride", Journal of Crystal Growth, 77 (1986) 7–10.

Hanabusa et al., "Photochemical Vapor Deposition of Aluminum thin films Using Dimethylaluminum Hydride", Japanese Journal of Applied Physics, vol. 27, No. 8, Aug. 1988, pp. L1392–L1394.

S. Magdo, "Pyramid Shaped Electrical Feedthrough in Silicon Wafers," IBM Technical Disclosure Bulletin, vol. 19, No. 4, Sep. 1976, pp. 1232–1233.

Patent Abstracts of Japan, vol. 012, No. 420 (E-679) Nov. 8, 1988, & JP-A-63 156 373 (Matsushita) Jun. 29, 1988.

Patent Abstracts of Japan, vol. 013, No. 230 (E-764) May 26, 1989, & JP-A-1 037 051 (NEC Corp.) Feb. 7, 1989.

*Primary Examiner*—Charles L. Bowers, Jr.
*Assistant Examiner*—Matthew Whipple
*Attorney, Agent, or Firm*—Fitzpatrick, Cella, Harper & Scinto

[57] ABSTRACT

A semiconductor device has a device region, and a device separation region formed on a semiconductor substrate doped with impurities. And, the device separation region has a metal wiring formed on the surface of the device region or the back surface of the substrate. An aluminum region extending in the longitudinal direction connected to the metal wiring is formed within the device separation region.

6 Claims, 12 Drawing Sheets

5,665,630

1

DEVICE SEPARATION STRUCTURE AND SEMICONDUCTOR DEVICE IMPROVED IN WIRING STRUCTURE

This application is a continuation of application Ser. No. 07/996,643 filed Dec. 24, 1992, now abandoned, which is a divisional of application Ser. No. 07/707,022 filed May 29, 1991, now U.S. Pat. No. 5,200,639.

BACKGROUND OF THE INVENTION

1. Field of the Invention

This invention relates to a semiconductor circuit device such as memory, photoelectric converting device, signal processing device, etc. to be mounted on various electronic instruments, particularly to a metal wiring structure and a semiconductor device improved in device separation structure.

2. Related Background Art

Conventionally, device separation in semiconductor device has been constituted as shown in FIG. 1A. In FIG. 1A, the symbol 1 is metal wiring, 2, 3 are device regions where transistor, FET, resistance, condenser, photosensor, etc. are formed, and electrical insulation thereof is effected by the device separation region, namely the Si substrate 4 doped with an impurity or the Si layer 5 doped with the same impurity. The potentials of the device separation regions of 4, 5 are fixed by the metal wiring 1 or 6.

For example, the device separation region of a solid image pick-up device is constituted as shown in FIG. 1B. In the Figure, the symbol 4 is a P type substrate, 5' an n$^+$ buried layer, 2 an n$^-$ epitaxial growth layer (hereinafter epitaxial growth is written as epi), 5 an n$^+$ layer. The above n$^-$ epi layer 2 is a photoelectric converting region, and the n$^+$ buried layer 5' and the n$^+$ layer 5 are device regions.

The n$^-$ epi layer 2 is maintained at a certain positive potential through the n$^+$ buried layer 5' and the n$^+$ layer 5. By the build-in electrical field through junction between the n$^-$ epi layer 2 and the n$^+$ layer 5, the electrons formed by photoirradiation are absorbed in the n$^+$ buried layer 5 and the n$^+$ layer 7, and the positive holes cannot be diffused to the confined adjacent picture elements, whereby cross-talk can be prevented.

However, prior art examples had the technical tasks as follows.

(1) There was an impedance of about some ten to some hundred Ω/□. For this reason, current flowed into the region 5, and when the potential is elevated, parasitic transistor turned on between the device regions 2 and 3, whereby latch-up or unstable actuation of function was caused to occur.

(2) On account of the impedance in the region 5, cross-talk in the device regions 2 and 3 was generated to cause unstable actuation.

Particularly in the case of a solid image pick-up device, (3) The positive holes having acquired thermally high energy will be diffused to the adjacent picture elements.

(4) Since the device separation region is also a semiconductor, carriers will be generated when light is irradiated.

(5) The width of the n$^+$-Si device separation cannot be made narrow in process to obstruct reduction of picture element, whereby higher resolving power of solid image pick-up device has been obstructed.

On the other hand, as the metal wiring structure in a highly integrated semiconductor device, for example, there has been known one having an interlayer insulating film 52 comprising silicon oxide, etc. formed on the surface of a semiconductor substrate 51 comprising silicon and a metal wiring layer 53 comprising Al, Al—Si, etc. formed on the interlayer insulating film 52 as shown in FIG. 2A.

In the semiconductor device equipped with the metal wiring of such structure, the sectional area of wiring has been increased by enlargement of the width dimensions of the respective wirings, thereby ensuring necessary current tolerant capacities for the respective wirings, and therefore the flat area of wiring will be increased and improvement of wiring without increasing the device size is limited.

For this reason, for improvement of wiring density, for example, a semiconductor device of a wiring structure having the respective wirings laminated in multiple layers as shown in FIG. 2B has been known.

In this semiconductor device, two layers of metal wiring are laminated through an insulating film.

In the following, the outline of the process for preparing the semiconductor device shown in 2B is described.

First, after formation of various necessary functional devices such as bipolar transistor, MOS transistor, MOS diode, etc. on a part of the surface of the semiconductor substrate 1, on the remaining surface of the semiconductor substrate 51 is formed a first interlayer insulating film 52 comprising PSG (Phospho silicate glass), etc. according to the normal pressure CVD method with a thickness of 0.5 to 1.0 μm, and the first interlayer insulating film 52 is applied with annealing.

Next, patterning by use of a resist is applied on the first interlayer insulating film 52 as described above to form openings 52a for taking out electrodes of various functional devices. Subsequently, according to the sputtering method, after deposition of a wiring material comprising, for example, Al—Si according to the sputtering method on the surface of the first interlayer insulating film 52 and internally of the openings 52a, the first wiring layer 53 is formed by patterning by use of a resist.

Next, on the first wiring layer 53 and the first interlayer insulating film 52 are formed a second interlayer insulating film 54 comprising PSG with a thickness of about 0.5 to 1.0 μm according to the normal pressure CVD method, openings 54a for connecting the first wiring layer and the upper wiring layer as described below to a part of the second interlayer insulating film 54 corresponding to the upper portion of the first wiring layer 53 are formed.

Next, on the second insulating film 54 and internally of the openings 54a, a wiring comprising, for example, Al—Si is deposited, followed by formation of the second wiring layer 55 for connecting the second wiring layer 55 for connecting the first wiring layer 53 through the portion of the openings 54a by patterning.

Next, on the second interlayer insulating film 54 and the second wiring layer 55, a passivation film 6 can be formed with a thickness of 0.5 to 1.0 μm according to the plasma CVD method to prepare a semiconductor device with a metal double layer wiring structure shown in FIG. 2B.

In the semiconductor device having a multi-layer wiring structure of such constitution, a wiring with wiring density by far higher than the semiconductor device with the mono-layer wiring structure shown 2A can be realized.

However, in the semiconductor device having a multi-layer wiring structure as described above, since an interlayer insulating film is provided between the wiring at the lower part and the wiring at the upper part, the surface stepped difference due to the wiring portion will become greater as the number of the lamination increases, whereby the degree of freedom in design in the wiring structure is regulated because of movement of the position (migration) of the wiring portion relative to the semiconductor substrate at the wiring portion or the shape of the contact hole necessary for connection between the respective insulating layers. Thus, also in this case, improvement of wiring density is limited and it has been difficult to enhance wiring density more than a certain level.

Further, in a semiconductor device with a multi-layer structure, surface unevenness becomes greater as the layer is upper, and therefore slippage in alignment becomes greater during mask registration in patterning when laminating further wiring, whereby wiring could not be formed with good precision at the predetermined position relative to the semiconductor substrate, thus involving the problem with respect to reliability of wiring.

SUMMARY OF THE INVENTION

A primary object of the present invention is to provide a semiconductor device having a wiring structure superior to the prior art.

Another primary object of the present invention is to provide a semiconductor device having superior device separation function than in the prior art.

First, an object of the present invention is to provide a semiconductor device having a device separation structure with a device region being formed on a substrate doped with an impurity, a device separation region doped with the same impurity as in the above substrate formed in the device region and a metal wiring formed on the surface of the above device region or on the back of the above substrate, wherein an aluminum deposited layer extending in the longitudinal direction connected to the above metal wiring is formed within the above device separation region.

Another object of the present invention is to provide a semiconductor device which can reduce the impedance of the device separation region of semiconductor device, prevent generation of latch-up or cross-talk and give stability in actuation.

Still another object of the present invention is to provide a semiconductor device equipped with a wiring structure which can ensure necessary current tolerable quantity even if the wiring flat area may be small.

Still another object of the present invention is to provide a semiconductor device comprising a device region formed on a substrate, and also a first device separation region formed doped with an impurity formed between the substrate and device region, with the respective ends being connected to both ends of the above-mentioned first device separation region, and the respective other ends exposed on the surface of the above-mentioned device regions, thus forming a trench metal layer of aluminum or composed mainly of aluminum.

Still another object of the present invention is to provide a semiconductor device comprising a device region formed on an insulating substrate, having a trench metal layer of aluminum or composed mainly of aluminum which becomes the device separation region extending in the longitudinal direction with its one end being in contact with the above-mentioned insulating substrate and its other end being formed exposed on the surface of the above-mentioned device region.

Still another object of the present invention is to provide semiconductor device which removed cross-talk between the picture elements and enables higher densification of picture elements by using a trench metal layer constituted by selective growth deposition of aluminum or a metal composed mainly of aluminum within the trench for forming the device separation layer.

Still another object of the present invention is to provide a semiconductor device which can also reduce the lay-out, because the trench metal layer can be used as the wiring line.

Still another object of the present invention is to provide a semiconductor device comprising a metal wiring layer for connecting at least two functional devices to the inner portion of a semiconductor substrate having at least functional devices as mentioned above.

DETAILED DESCRIPTION OF THE PREFERRED EMBODIMENTS

One preferred embodiment of the present invention has a longitudinally lengthy buried region comprising a metal in the device separation region.

When the predetermined region which is a part of the semiconductor substrate and the longitudinally lengthy buried region of a metal are electrically connected, the following embodiment is taken.

For example, when the metal is electrically connected to a predetermined region only at bottom, the whole side wall should be preferably coated with an insulating film.

On the other hand, when the metal is insulated from a part of the side groove or bottom of the groove, only said part is coated with an insulating film.

EXAMPLE 1

Figure 1A:
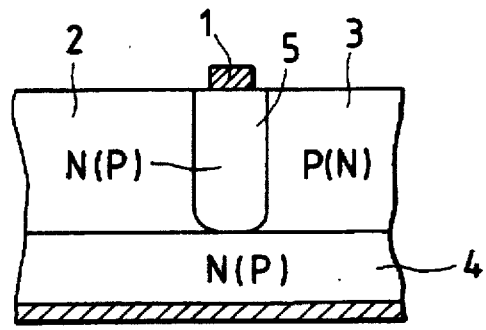
FIGS. 1A, 1B, 2A, 2B are constitutional views for illustration of the semiconductor device of the prior art.
Figure 1B:
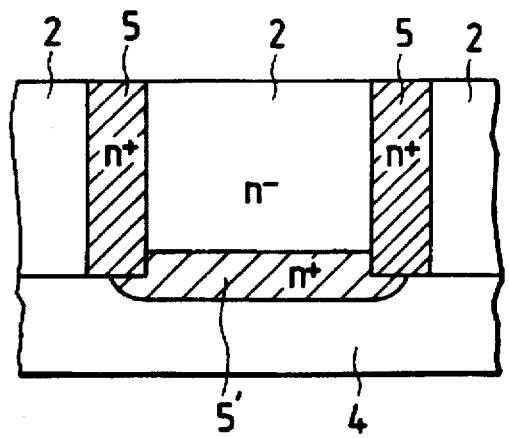
Figure 2A:
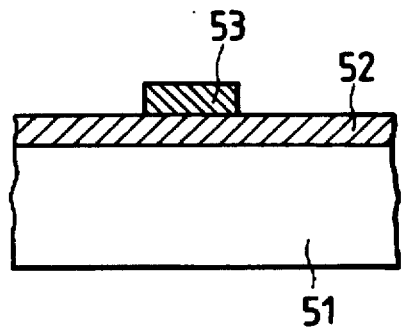
Figure 2B:
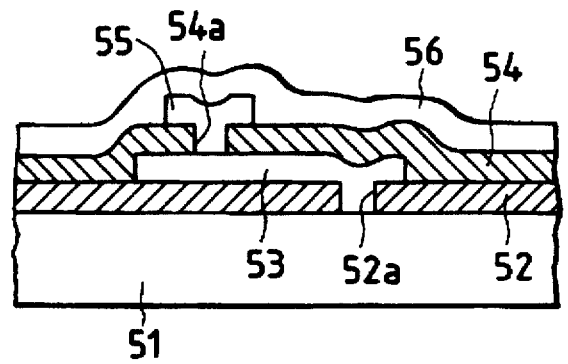
Figure 3:
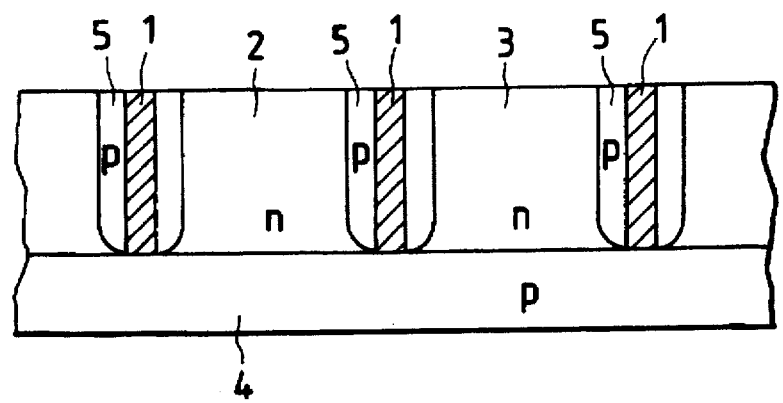
FIG. 3 is a constitutional view of the pertinent portion of the semiconductor device showing a first example of the present invention.

FIG. 3 is a drawing best representing the specific feature of the first example of the present invention, in which the symbol is the device separation wiring formed in the longitudinal direction within the device separation region 5 as described below according to the Al-CVD method as described below, 2 the first device region, 3 the second device region, 4 the Si substrate doped with an impurity, 5 the device separation region doped with an impurity of the same type as in the substrate 4.

As shown in the drawing, by deposition the device separation wiring 1 deeply in the longitudinal direction with an aspect ratio of 1.0 or more, preferably 2.0 or more, optimally 3.0 or more, the impedance of the device region 5 can be reduced without bringing about increase of chip area. By reduction of impedance, the following effects can be obtained:

(1) Prevention of latch-up;

(2) Improvement for functional lowering due to mutual interference between devices (reduction of cross-talk).

Next, the process for preparing a semiconductor device having the device separation structure with the above constitution is described.

i) On a mono-electroconductive semiconductor substrate, for example, a P-type Si substrate 4, an n-type epi-layers 2, 3 are formed by epitaxial growth as the layer having the impurity of the reverse conduction type to the substrate 4.

ii) Next, after formation of the oxidized film to 0.5 to 1.0 µm on a surface of above-mentioned epi-layers 2, 3 by thermal oxidation, impurities (e.g. P type) with the reverse conduction type to the epi-layers 2, 3 are formed on the device separation region 5 by patterning by ion injection with the above-mentioned oxidized film as the mask. The diffusion layer is made so as to reach the subbing semiconductor substrate 4.

iii) Next, after the oxidized films on the surfaces of the epi-layers are removed, again oxidized films with a thickness of 100 to 1000 Å are formed. Then, the above-mentioned device separation region 5 is internally opened by resist patterning, and the oxidized film and the epi-layer are etched in two steps with the resist as the mask to form grooves. In this case, the depth of the groove is made to reach the subbing semiconductor substrate 4. After completion of etching, the resist is removed.

iv) Next, by use of DMAH and hydrogen as the Al-CVD method as described above, Al is buried in the grooves provided within the epi-layers 2, 3. Here, the material to be buried within the grooves is not limited to Al, but Al—Si, Al—Ti may be also used as the metal material as described above.

EXAMPLE 2

Figure 4:
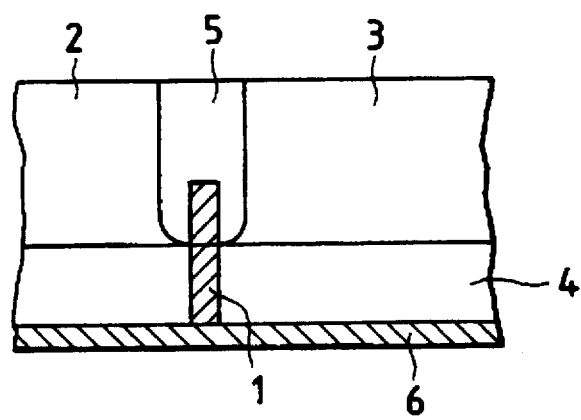
FIG. 4 is a constitutional view of the pertinent portion of the semiconductor portion showing a second example of the present invention.

FIG. 4 shows a drawing representing best the specific feature of the second example, wherein the symbol 1 is the device separation wiring of the buried type with a large aspect ratio, 2 the first device region, 3 the second device region, 4 the Si substrate doped with an impurity, 5 the device separation Si doped with the impurity of the same type as in 4, and 6 the back metal wiring.

By fixing of the potential in the device separation region 5 with the device separation wiring 1 and the back metal wiring 6, no wiring from the chip upper surface will be required to result in reduction of chip area.

Next, the process for preparing the semiconductor device having the device separation structure having the above-mentioned structure is described.

The steps i)–ii) are practiced in the same manner as in Example 1, and hence description thereof is omitted. iii) Next, after formation of an oxidized film on the back surface of the semiconductor substrate 4 by thermal oxidation, patterning is effected so as to form openings only on the back surface of the semiconductor substrate 4 immediately below the above device separation region 5.

Then, continuously to the oxidized film from the back surface of the semiconductor substrate 4, the semiconductor substrate 4 is etched to provide grooves on the back surface of the semiconductor substrate 4. The depth of the grooves is made to extend through the semiconductor substrate 4 until reaching the above-mentioned diffusion layer 5 for device separation. iv) Next, as the Al-CVD method, Al is deposited selectively at the groove portions similarly as in Example 1 to bury Al within the grooves. Then, according to the sputtering method of the non-selective mode, an Al film is formed on the whole back surface of the semiconductor substrate 4.

EXAMPLE 3

Figure 5:
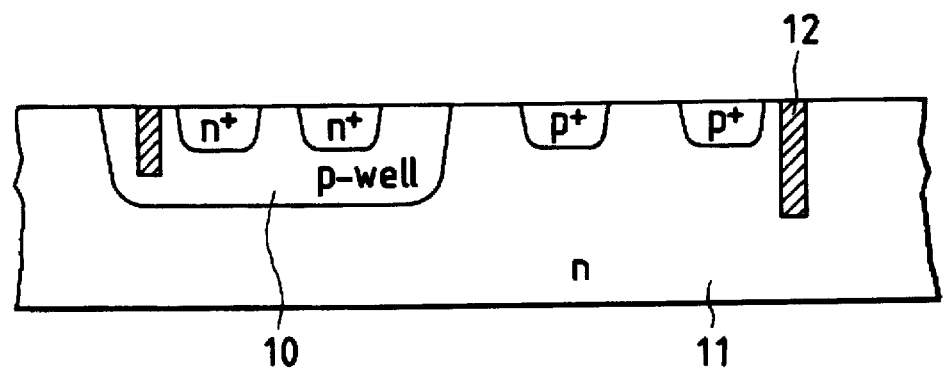
FIG. 5 is a constitutional view of the pertinent portion of the semiconductor portion of the semiconductor device applied to the present invention.

Next, the semiconductor functional devices formed in the device region 2 or 3 is described by referring to FIG. 5 and FIG. 6. The semiconductor functional device is characterized by forming a device wiring 12 with a large aspect ratio for fixing the back gate of the MOS type transistor (P well region 10 of nMOS, and n-epi or n-well region 11 of pMOS) at any desired potential in the P-well region 10 the n-epi or n-well region in the longitudinal direction according to the Al-CVD method as described above.

EXAMPLE 4

Figure 6A:
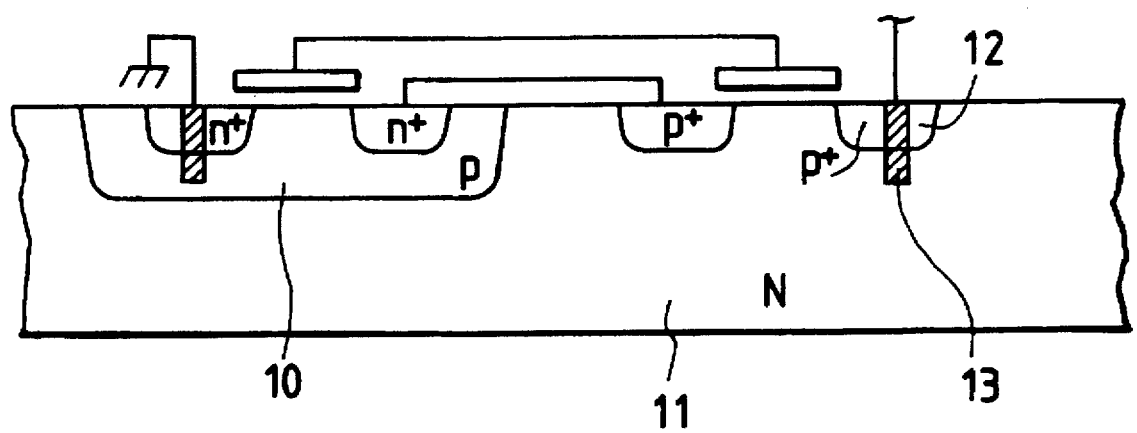
FIG. 6A is a constitutional view of the semiconductor device applied to the present invention.
Figure 6B:
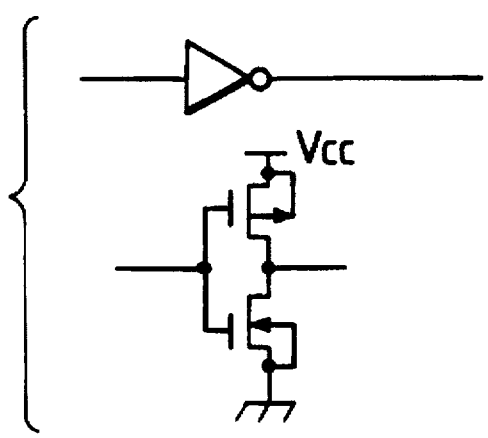
FIG. 6B is a circuit diagram of the same device.

FIG. 6A is a sectional constitutional view of another semiconductor functional device, and FIG. 6B is the circuit diagram of the same device. The device is characterized by forming the device separation wiring 12 for reducing the resistance in the back gate when the P-well 10 which is the back gate of the MOS type transistor and the n-epi or n-well 11 are at the same potential as the source region (or drain region) in the source (or drain) region 13 according to the Al-CVD method as described above.

In the MOS type transistor of the prior art, the resistance of the back gate has been a cause for latch-up or lowering in function. Also, since the device region and the wiring region have been increased in order to reduce this problem, increase of layout area has been brought about.

In contrast, in the above-mentioned device, as shown in FIG. 5 and FIG. 6A, by depositing the device wiring 12 deeply in the longitudinal direction according to the Al-CVD method, the resistance of the back gate can be reduced with smaller wiring area to ameliorate latch-up or lowering in function which has been the problem in the prior art. Particularly, in the logical circuit (e.g. invertor) as shown in FIG. 6, the wiring structure can be made as shown in the figure in the region where the power source and the source (or drain) are at the same potential, whereby less wiring area is required and the problems of the prior art can be improved.

Next, the process for preparing the device shown in FIG. 5 is described by referring to FIG. 7A to FIG. 7D.

Figure 7A:
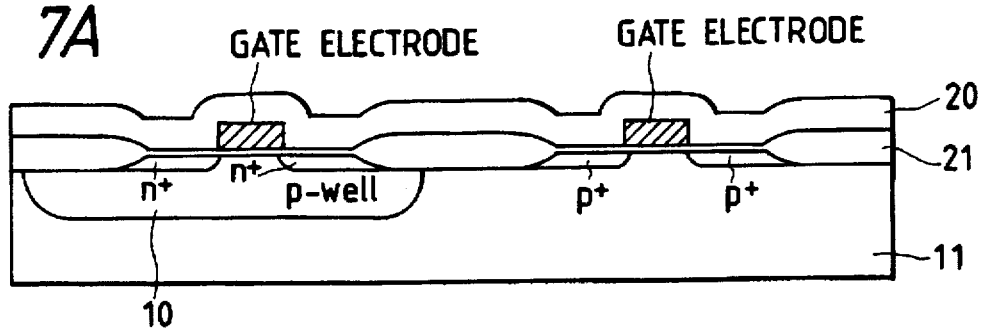
FIGS. 7A to 7D are diagrams of the steps for preparing the semiconductor device applied to the present invention.

First, according to the known C-MOS preparation technique, working is practiced to the state immediately before formation of contact holes (FIG. 7A).

Figure 7B:
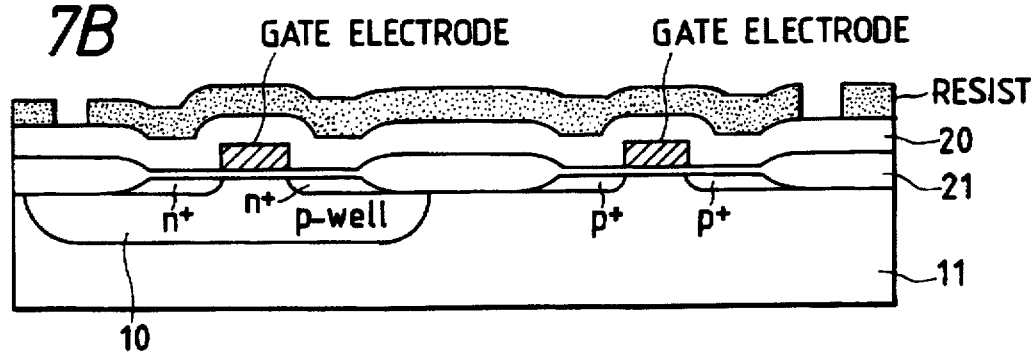

Next, according to the photolithography by use of a resist, a resist image corresponding to the openings to be formed of about 0.8 μm at the P-well portion of n-MOS, the n-epi or n-well portion 11 of P-MOS (FIG. 7B).

Next, by use of the $CHF_3$—$C_2F_6$ type dry etching, openings 22 extending through the two layers of the interlayer insulation layer 20 and the field oxidized film 21 are formed. Then, without removal of the resist, the silicon substrate is etched vertically to about 1 μm by the $Cl_2$—$CBrF_3$ type dry etching.

Figure 7C:
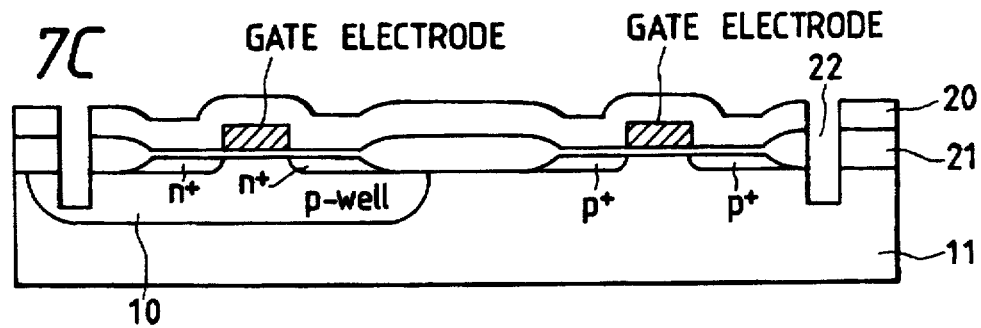
Figure 7D:
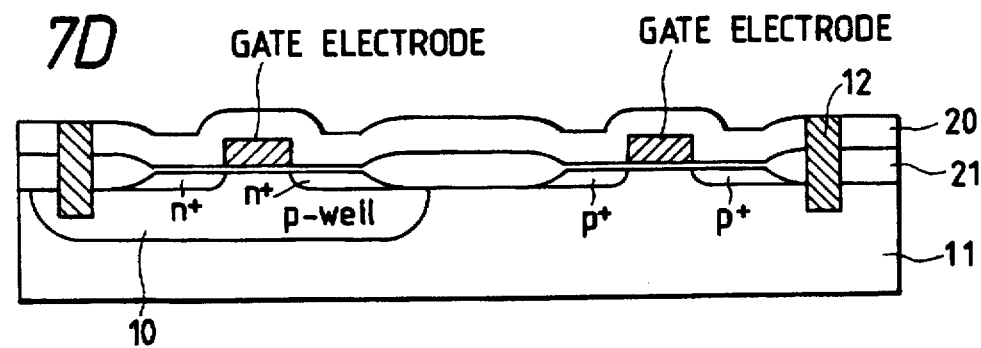

Next, by use of the Al-CVD method as described in Example 1, aluminum 12 is buried to the upper surface of the interlayer insulation film. The total amount buried is made 2.5 μm as the total with the silicon substrate groove being 1 μm, the field oxidized film 21 being 8000 Å, and the interlayer insulation layer 20 being 7000 Å. (FIG. 7C).

Employing subsequently known techniques contact opening formation, aluminum wiring formation, etc. can be practiced to complete the sample.

Preparation of the example shown in FIG. 6 can also be practiced according to the same procedure as in FIG. 5. The difference is only that the opening formation site becomes the source (or drain) portion of the MOS transistor, and the interlayer insulation layer-gate oxidized film is extended through instead of extending through of the interlayer insulation layer-field oxidized film during opening formation.

As described above, by depositing Al in the longitudinal direction by use of the Al-CVD method within the device separation region, reduction of chip area can be effected as compared with the case when obtaining the same effect without use thereof, whereby Al wiring portion can be made smaller, with the result that the production cost can be made lower.

EXAMPLE 5

Figure 8:
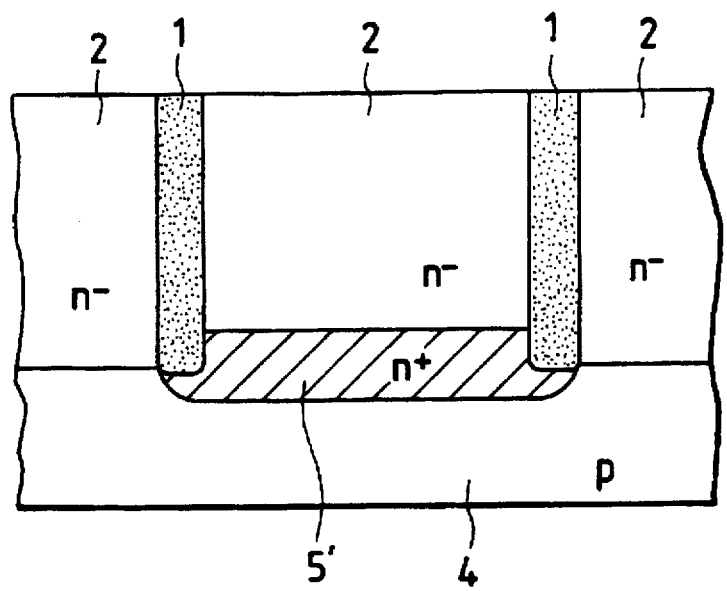
FIG. 8 is a constitutional view of the pertinent portion of the semiconductor device showing a third example of the present invention.

FIG. 8 is a drawing showing best the specific feature of the present example of the present invention, in which the symbol 4 is a P substrate, 5' an $n^+$ buried layer, 2 an $n^-$ epi-layer, and 1 a trench metal layer formed according to the CVD method. The above trench metal layer 1 has its one end exposed on the above $n^-$ epi-layer surface 2 with other end being connected to the above $n^+$ buried layer 5'.

The $n^-$ epi-layer 2 is a photoelectric converting region (called device region or activation region), and the $n^+$ buried region 5' and the trench metal layer 1 are device separation regions. The trench metal layer 1 is also a wiring line.

The $n^-$ epi-layer 2 is maintained at a certain potential through the $n^+$ buried layer 5' and the trench metal layer 1.

In the above-mentioned structure, the electrons formed by photoirradiation are absorbed primarily into the $n^+$ buried layer 5' through the built-in electrical by the junction of the $n^+$ buried layer 5' and the $n^-$ epi-layer 2. The positive holes are closed within the picture elements by the built-in electrical field.

The positive holes which tend to be diffused to the adjacent picture elements will all be absorbed in the trench metal layer 1, and therefore there can be no cross-talk between picture elements.

The device separation region 1 is formed by forming the trench (groove) by etching, and then depositing aluminum or a metal composed mainly of aluminum on the groove according to the selective CVD method as described above, whereby the device separation region width can be reduced as compared with the prior art, enabling higher densification of picture elements.

The trench metal layer 1 has a low resistance and therefore can be also utilized as the wiring line, whereby reduction of the layer is rendered possible.

Next, a process for preparing the device separation structure semiconductor device of the above constitution is described.

i) On a monoconduction type semiconductor, for example a P type Si substrate 4 are formed grooves with wide width shallowly on a part thereof. In the grooves, $n^+$ buried layer 5' containing impurities of the opposite conduction type to the substrate 4 according to the epitaxial growth by use of a mask.

ii) On the substrate 4 having the $n^+$ buried layer 5' formed as described above, an $n^-$ epi-layer 2 which becomes the photoelectric converting region is formed by epitaxial growth.

iii) Next, after formation of oxide films with a thickness of 0.5 to 1.0 μm on the surface of the above $n^-$ epi-layer 2 by thermal oxidation, opening are formed internally of the above $n^-$ epi-layer at the both ends of the above-mentioned $n^+$ buried layer by resist patterning, followed by etching with the resist as the mask to form a trench. In this case, the depth of the trench is made the depth which reached the subbing $n^+$ buried layer 5'. After completion of etching, the resist was removed.

iv) Next, by use of the Al-CVD method as described below using DMAH and hydrogen as the selective CVD method, the substrate surface temperature was maintained at 270° C., and Al is buried in the trench provided within the $n^-$ epi-layer. Here, the material to be buried in the trench is not limited to Al, but Al—Si, Al—Ti, etc. may be also employed as the metal material.

EXAMPLE 6

Figure 9:
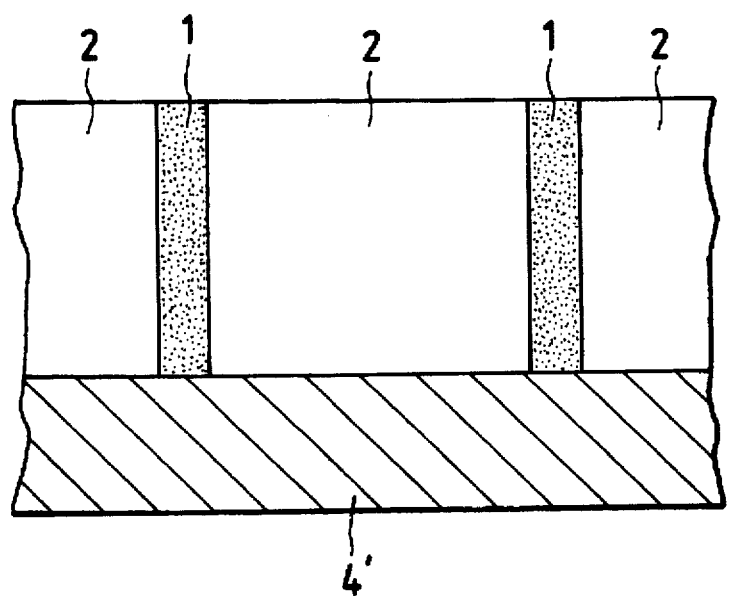
FIG. 9 is a constitutional view of the semiconductor device showing a fourth example of the present invention.

FIG. 9 is an example in which the present invention is applied to a semiconductor device having an insulating substrate. 1 is a trench metal layer, 4' an insulation substrate and 2 a semiconductor substrate layer.

The above semiconductor layer 2 is a photoelectric converting region, and the trench metal layer 1 is a device separation region and a wiring line. By the trench metal layer 1, it becomes possible to obtain a semiconductor with high density without cross-talk.

Next, a process for preparing a device separation structure semiconductor structure of the above constitution is described.

i) On an insulation substrate 4' comprising sapphire, a semiconductor layer 2 comprising a photoelectric converting region (device region) is formed by epitaxial growth.

ii) Next, after formation of an oxidized film to 0.5 to 1.0 μm on the surface of the above semiconductor layer 2 by thermal oxidation, opening are formed internally the above semiconductor layer by resist patterning, and etching effected with the resist as the mask to form a trench. In this case, the depth of the trench is made the depth which reaches the subbing insulating substrate 4'. After completion of etching, the resist is removed.

iii) Next, by use of DMAH and hydrogen as the selective CVD method as described above, the substrate surface temperature is maintained at 270° C., and aluminum is buried in the trench provided within the semiconductor layer 6. Here, as the metal material, aluminum is not limitative, but Al—Si, Al—Ti, etc. may be also used as mentioned above.

As described above, by use of the trench metal layer as the device separation region, it becomes possible to obtain a semiconductor device with high picture element density and reduced chip size without cross-talk between the picture elements.

Another preferred embodiment of the present invention has a part of the metal wiring for connecting a plurality of devices formed not on the insulating film on the semiconductor substrate but within the groove formed on the semiconductor substrate.

EXAMPLE 7

Figure 10A:
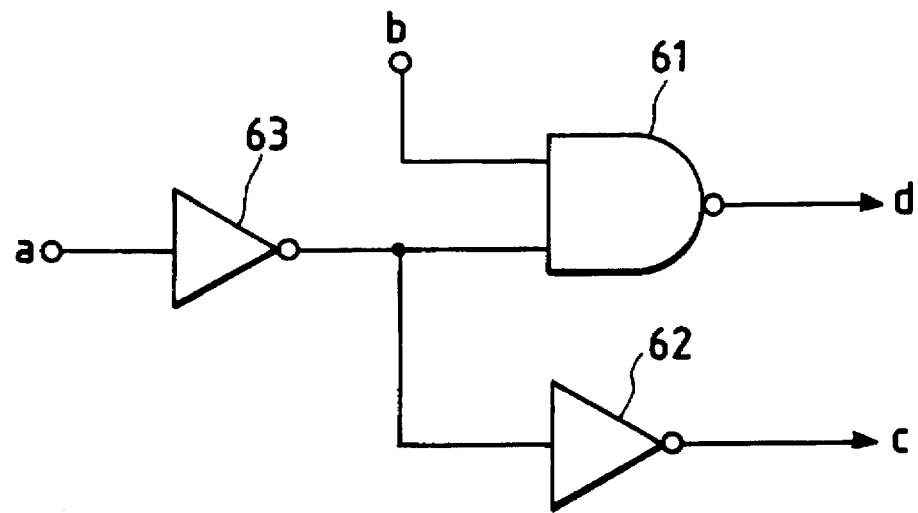
FIGS. 10A and 10B are schematic views for illustration of the logic circuit according to the present invention.
Figure 10B:
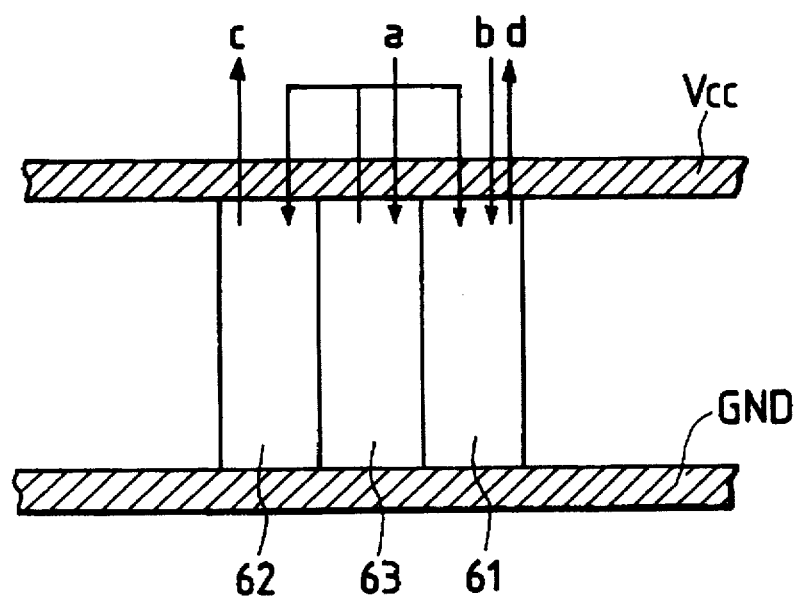

FIG. 10A is a circuit diagram showing a part of the logic circuit of the CMOS constitution, and FIG. 10B a schematic view showing the lay-out thereof.

Thus, the power source line Vcc and the earthline GND are commonly arranged for the respective cells. In these lines, reduction of the impedance, avoidance of erroneous actuation and further avoidance of lowering in reliability by migration, etc. are particularly demanded.

Hence, by use of buried wirings in these lines, in addition to functional aspect, improvements in physical aspect such as reduction of occupied area, reduction of stepped difference, etc. can be effected.

Similarly, the buried wiring also has the effect even by use of the clock-line for transmitting the clock signals. In this case, after formation of the groove for forming such wiring in the semiconductor substrate, the whole inner surface of the groove is covered with an insulating layer. And, by depositing a semiconductor material or an electroconductive material within the groove, a subbing layer for selective deposition of a metal is formed. And, by burying a metal within the groove, the semiconductor device of the present embodiment is formed.

Figure 11:
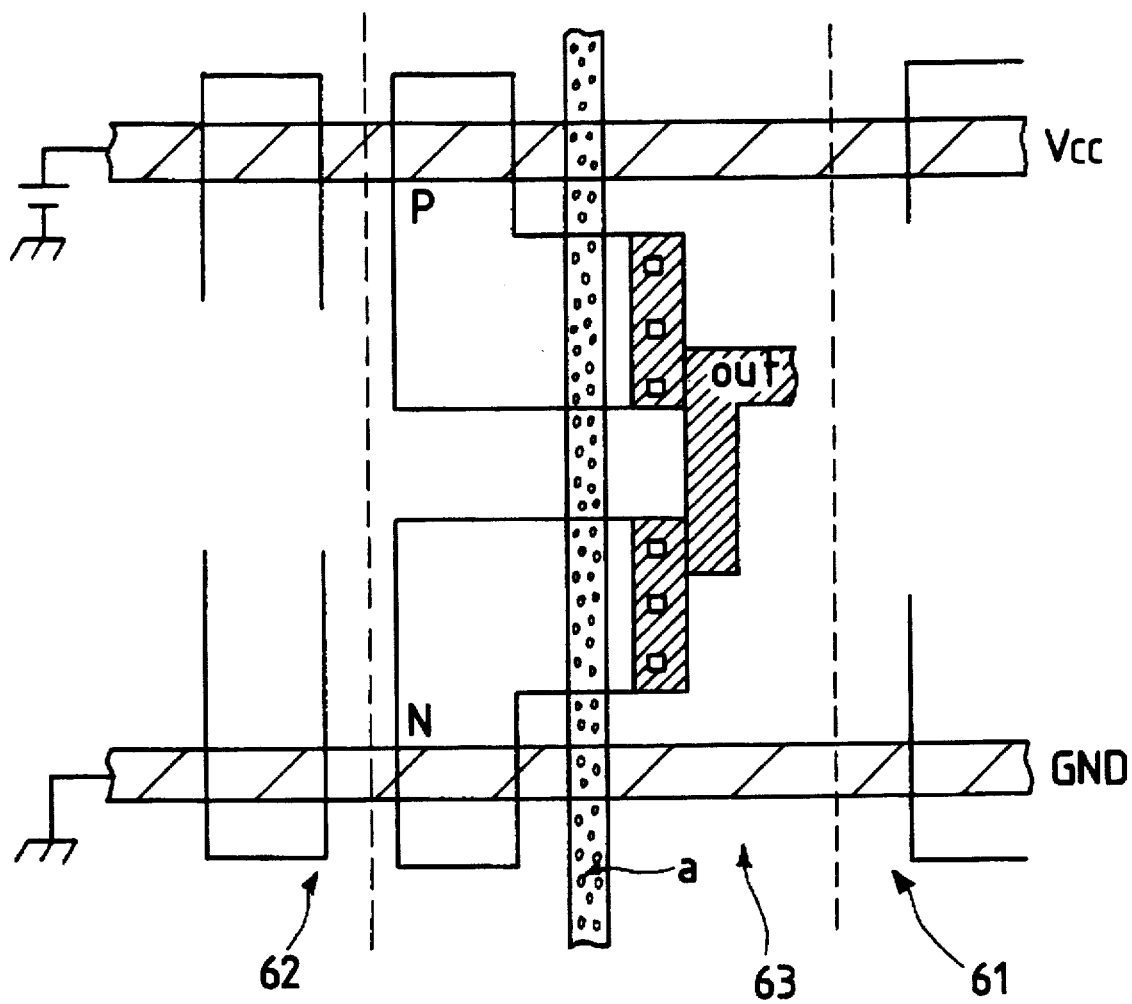
FIG. 11 is an upper view showing the logic circuit according to the present invention.

FIG. 11 is a schematic view for illustrating in more detail FIG. 10B, and 63 is the same invertor as the CMOS in FIG. 6.

Here, the line Vcc and the line GND are both buried wirings connected to the source region and the well region of the two MOSFET's, forming the common line for the both adjacent cells 61, 62.

a is the polycrystalline gate electrode which becomes the input of the invertor, out is the drain wiring which becomes the output of the invertor. In this example, differs from the prior art, the power source lines Vcc and the earthline GND are wirings of the lower layers than the gate electrode a.

In the semiconductor device of the present embodiment, since the metal wiring layer is provided within the substrate, a predetermined current tolerant capacity can be ensured by making larger the depth dimension without increasing the plan area of the metal wiring layer, and also the unevenness of the device surface can be inhibited minimum, whereby the relative movement of the wiring layer relative to the substrate can be removed to improve the precision of the formation position of the wiring layer.

EXAMPLE 8

Figure 12:
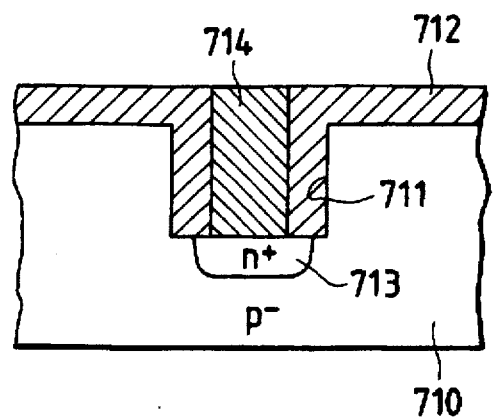
FIG. 12 is a schematic sectional view showing the wiring structure intended to apply a positive potential.
Figure 13:
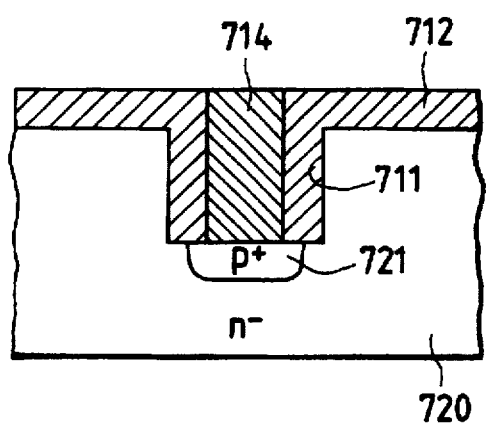
FIG. 13 is a schematic sectional view showing the wiring structure intended to apply a negative potential.

FIG. 12 and FIG. 13 are both Figures representing the characteristic portions of the wiring structures in the semiconductor devices of the present invention. Here, FIG. 12 shows the wiring structure constituted for the purpose of applying a positive voltage as the power source line, and FIG. 13 the wiring structure constituted for the purpose of applying a negative voltage as the earth line. These wiring structures are the embodiments of the present invention in that they are constituted on the basis of the technical thought of the present invention except that the kinds of the materials for forming the respective portions are different concerning the application method of voltage. Therefore, the constitution of the former and the preparation method thereof are described before description of the constitution and the preparation method thereof in difference from the former.

In FIG. 12, the symbol 710 is a P⁻ type semiconductor substrate comprising, for example, silicon, etc. On the surface of the substrate 710 is formed a groove 711 by conventional means such as etching, etc., and the inner surface excluding the bottom surface of the groove 711 and the surface of the substrate 710 is formed an insulation layer 712 comprising oxidized silicon, etc. formed by the thermal oxidation method or the CVD method, etc. continuously. From the bottom surface of the groove 711 to internally of the substrate 710 as described above, if necessary, an $N^+$ type diffusion layer 713 is provided, which is formed by thermal diffusion as the semiconductor region doped with an impurity of the opposite type to the conduction type of the semiconductor such as silicon forming the substrate 710.

Internally of such groove 711, a metal wiring layer 714 comprising a metal such as Al, etc. is provided. The metal wiring layer 714 may be also formed by use of a conventional method such as bias sputtering, etc., but preferably it can be also formed by use of the Al-CVD method as described below. The Al-CVD method is a film forming method with good reproducibility which can form a metal film of Al, etc. selectively on the substrate 710, namely the bottom of the groove 711 in this case without formation on the insulation layer 712 comprising silicon oxide.

The wiring film thus formed is used for connection between the predetermined electrode terminals mutually between two functional devices or, if necessary, 3 or more functional devices, to constitute an electrical circuit. For example, it may be suitably used for connection between two source-drains of MOSFET or collectors of a bipolar transistor, or between MOSFET or a bipolar transistor and a diffusion resistance, between MOSFET or a bipolar transistor and a capacity device, etc.

Next, an example for preparing the wiring structure with such constitution is described.

First, as shown in FIG. 12, a P⁻ type silicon substrate 710 is prepared as the semiconductor substrate.

Subsequently, on the surface of the substrate 710, after application of a patterning by use of a resist, a groove 711 for formation of a wiring layer is formed by application of etching.

Then, an insulation layer 712 with a film thickness of 0.5 to 1.0 µm is formed according to the thermal oxidation method or the CVD method on the surface of the substrate 710 and the inner surface of the groove 711.

Next, after application of a patterning by use of a resist on the whole surface of the substrate 711 excluding the bottom of the groove 711, the oxidized film layer formed on the bottom of the groove 711 is removed by anisotropic etching such as RIE (reactive ion etching) to have the silicon portion of the substrate 710 exposed.

Next, at the silicon exposed portion of the bottom of the groove 711, an impurity of the type opposite to the conduction type of the material for forming the substrate 710 is doped according to the ion injection method of the thermal diffusion method, followed by diffusion to form an N⁺ type diffusion layer 713.

Subsequently, on the N⁺ type diffusion layer 713, according to a conventional film forming method such as sputtering or the Al-CVD method, a metal wiring layer 714 comprising Al, etc. is formed. The metal wiring layer 714 should be desirably formed so that its upper may be coplanar with the upper surface of the insulation layer 712 formed on the surface of the substrate 710 around the groove 711 in accomplishing surface flattening of the semiconductor device. In such metal wiring layer 714, electrical separation is effected from the P⁻ type silicon substrate 710 through the insulation layer 712 as the insulation film formed on the inner surface of the groove 711 and the N+ type diffusion layer 713 as the P-N separation layer formed on the bottom of the groove 711.

According to the selective Al-CVD method as described above, the Al film is deposited selectively on the N⁺ type diffusion layer 713 comprising silicon as described above, but not on the insulation layer 712 comprising silicon oxide. Therefore, by use of the selective Al-CVD method, there is the advantage that no patterning with resist, etc. as required in the case of a conventional film forming method such as sputtering, etc. need be applied. Also, the depth dimension of the groove 711 as described above is relatively longer than the width dimension, and even in the case when the width dimension itself is short, there is the advantage that an Al film of good quality can be formed from the bottom of the groove 711. Therefore, it is sufficiently applicable to a fine structure with an aspect ratio of 1.0 or more as a matter of course, even 1.5 or more, further 2.0 or more. Further, because an Al film of good quality can be also formed internally of a deep groove 711 easily, the current tolerance of the metal wiring layer 714 can be easily increased by enlarging the depth dimension without enlarging the width dimension of the metal wiring layer 714.

Next, the wiring structure shown in FIG. 13 is described. In FIG. 13, the same portions as the constitution in FIG. 12 are affixed with the same symbols for brevity of the description.

In FIG. 13, the symbol 720 is an N⁻ type semiconductor substrate comprising, for example, silicon, as the substrate. On the surface of the substrate 720 is formed a groove 711 by conventional means such as etching, etc. and on the inner surface excluding the bottom internally of the groove and the surface of the substrate 720 is formed continuously an insulation film 712 comprising silicon oxide, etc. according to the thermal oxidation method or the CVD method. Internally of the substrate of the substrate 720 from the bottom of the groove 711 as described above, an impurity of the conduction type opposite to that of the semiconductor such as silicon, etc. for forming the substrate 720 to provide a P⁺ type diffusion layer 21 as the semiconductor region formed by thermal diffusion.

Internally of such groove 711, a metal wiring layer 714 comprising a metal such as Al, etc. is provided. In such metal wiring layer 714, electrical separation is effected from the N⁻ type silicon substrate 720 through the insulation layer 712 as the insulation film formed on the inner surface of the groove 711 and the P-N separation layer formed on the bottom of the groove 711. Therefore, substantially no leak current from the metal wiring layer 714 to the substrate will occur.

The wiring structure of the present invention with such constitution can be utilized for all functional devices, namely field effect transistors, bipolar transistors, diffusion resistances, etc.

Figure 14:
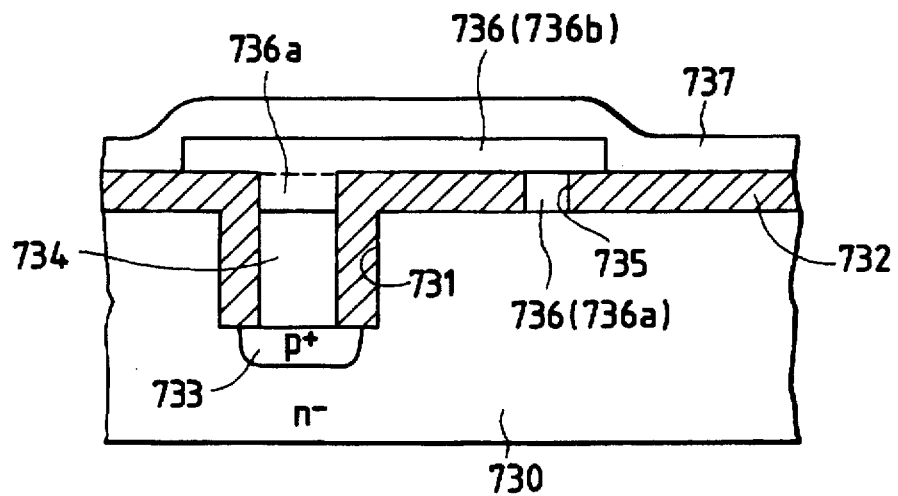
FIG. 14 is a schematic sectional view showing an example of a multi-layer wiring structure in the semiconductor device of the present invention.

FIG. 14 is an example of the wiring structure of the present invention, which is a schematic sectional view showing a wiring structure of two metal layers.

In FIG. 14, the symbol 730 is an N⁻ type semiconductor substrate comprising, for example, silicon. On the surface of the substrate 730 is formed a groove 731 according to conventional means such as etching, etc., and on the inner surface excluding the bottom internally of the groove 731 and on the surface of the substrate 730 are formed continuously an oxidized film layer 732 comprising silicon oxide, etc. according to the thermal oxidation method or the CVD method. From the bottom of the groove 731 as described above to internally of the substrate 730 is doped an impurity of the conduction type opposite to that of the semiconductor such as silicon, etc. forming the substrate 730 to provide a P⁺ diffusion layer 733 formed by thermal diffusion.

Internally of such groove 731, a first wiring layer 734 comprising, for example, Al, etc. is formed according to the selective Al-CVD method as described below. The first metal wiring layer 734 has its upper surface coplanar with the surface of the substrate 730.

On a part of the oxidized film layer 732 as described above, openings 735 for taking out the electrode of the semiconductor device reaching the surface of the substrate 730 are formed.

On the surface of the oxidized film layer 732 together with the inner portion of the openings 735 and the inner portion of the groove 731 at upper portion of the first metal wiring layer 734, a second metal wiring layer 736 comprising a metal such as Al, etc. is formed. A passivation film 737 comprising, for example, silicon nitride, etc. is formed on the second metal wiring layer 736 and the oxidized film 732.

Figure 15A:
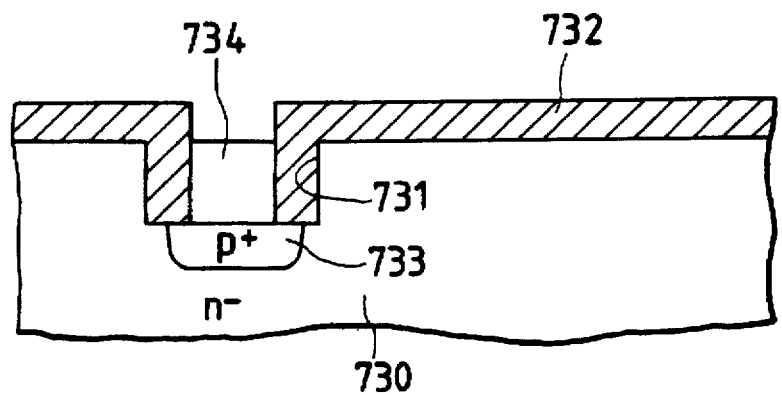
FIGS. 15A to 15C are schematic views for illustration of the preparation method of the wiring structure in FIG. 14.
Figure 15B:
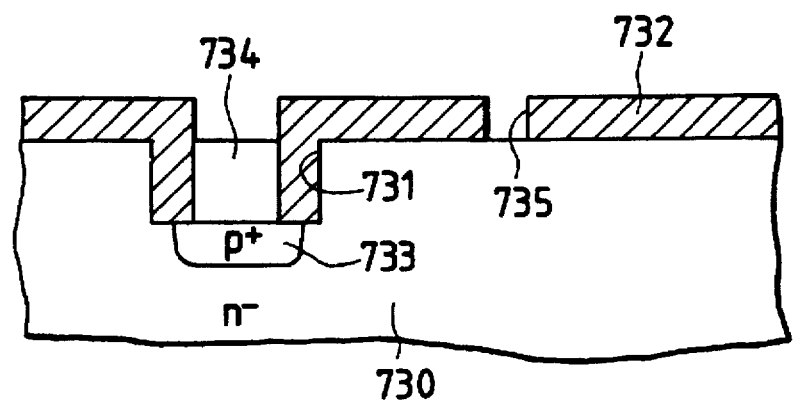
Figure 15C:
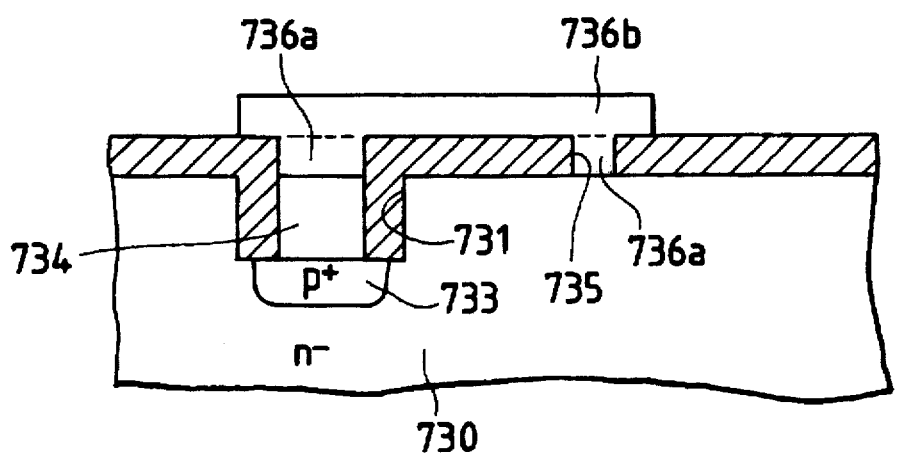

Referring next to FIG. 15A to FIG. 15C, a method for preparing a semiconductor device having the wiring structure with the constitution shown in FIG. 3.

First, as shown in FIG. 14A, an N⁻ type silicon substrate 730 is prepared.

Next, after application of a patterning by use of a resist on the surface of the substrate 730, a groove 731 for formation of a first metal wiring layer is formed.

Next, an oxidized film layer 732 with a film thickness of about 0.5 to 1.0 μm is formed on the surface of the substrate 730 the inner surface of the groove 731 according to the thermal oxidation method.

Next, after application of a patterning by use of a resist on the whole surface of the substrate 730 excluding the bottom of the groove 731, the oxidized film layer formed on the groove 731 is removed by anisotropic etching of RIE (reactive ion etching) to have the silicon portion of the substrate 730 exposed.

Next, the silicon exposed portion at the bottom of the groove 731 is doped with B as the impurity of the conduction type opposite to that of the material for forming the substrate 730 according to the ion injection method, followed by diffusion to form a P⁺ diffusion layer 733.

Next, on the P⁺ type diffusion layer 733 is formed a first metal wiring layer 734 comprising Al, etc. according to the selective Al-CVD method as described above. The first metal wiring layer 734 is formed so that its upper surface became coplanar with the upper surface of the substrate 730 around the groove 731. The first metal wiring layer 734 is separated electrically from the N⁻ type silicon substrate 730 through the oxidized film layer 732 as the insulation film formed on the inner surface of the groove 731 and the P+ type diffusion layer 733 as the P-N separation layer formed on the bottom of the groove 731. And, it is confirmed that there is substantially no leak of current from the first wiring layer 734 to the substrate 730.

Next, after application of a patterning by use of a resist on the surface of the oxidized film layer 732, openings 735 for taking out the electrode of the semiconductor device reaching the surface of the substrate 730 are formed in a part of the oxidized film layer 732 (FIG. 15B).

Next, internally of the openings 735 and internally of the groove 731 at the upper portion of the first metal wiring layer 734 is formed by depositing a second metal wiring lower layer 736a comprising Al utilizing DMAH and hydrogen as the Al-CVD method at a substrate surface temperature of 270° C. The second method wiring lower layer 736a is formed so that its surface may be coplanar with the upper surface of the oxidized film layer 732. Next, on the respective upper surfaces of the second metal wiring lower layer 736a and at the predetermined positions on the surface of the oxidized film layer 732 are formed the upper second metal wiring layer 736b comprising Al according to the sputtering method (see FIG. 15C).

Further, on the second metal wiring layer 736 and the oxidized film layer 732, a passivation film 737 comprising silicon nitride with a film thickness of about 0.5 to 1.0 μm is formed according to the plasma CVD method to obtain a semiconductor device equipped with the metal double layer wiring structure as shown in FIG. 14.

Also in the semiconductor device with such constitution, the first metal wiring layer 734 provided internally of the N⁻ type silicon substrate 730 is separated from the N⁻ type silicon substrate 730 through the oxidized film layer 732 as the insulation film on the inner surface of the groove 731 and the P+ type diffusion layer 733 as the P-N separation layer at the bottom of the groove 731, and there will be substantially no leak of current from the first metal wiring layer 734 to the substrate 730. In the first metal wiring layer 734, the desired current tolerance can be ensured by enlarging the depth dimension without enlarging its flat area. Also, since the unevenness of the surface of the semiconductor device can be inhibited minimum, there is no relative movement of the first metal wiring layer 734 to the substrate 730 to effect improvement of the precision of the formation position of the first metal wiring layer 734, and also the number of the multiple layers of wiring can be increased within the range of a limited thickness of the device. Further, since no interlayer insulation film is required between the first metal wiring layer and the second metal wiring layer, the surface stepped difference can be reduced in the case of providing wiring layers of the third metal wiring layer et seq, whereby reliability of the wiring layers of the third layer et seq can be improved.

As described above, according to the present invention, a wiring structure capable of ensuring necessary current tolerance can even with a small wiring flat area and also capable of being formed at a high positional precision can be obtained.

The film forming method suitable for the present invention is to form a deposited film by the surface reaction on an electron-donative substrate by use of a gas of an alkylaluminum hydride and hydrogen gas (hereinafter called the Al-CVD method).

Particularly, by use of monomethylaluminum hydride (MMAH) as the starting gas or dimethylaluminum hydride (DMAH) as the starting gas, and $H_2$ gas as the reaction gas, and heating the substrate surface under the mixture of these gases, an Al film of good quality can be deposited. Here, during the selective deposition of Al, it is preferable to maintain the surface temperature at the decomposition temperature of the alkylaluminum hydride or higher and less than 450° C., more preferably 260° C. to 440° C.

As the method for heating the substrate to the above-mentioned temperature range, there are direct heating and indirect heating. Particularly, by maintaining the substrate at the above-mentioned temperature by direct heating, an Al film of good quality can be formed at high deposition speed. For example, when the substrate surface temperature during Al film formation is made 260° C. to 440° C. which is a more preferable temperature range, a film of good quality can be obtained at higher deposition speed of 300 Å to 5000 Å/min. which is higher than in the case of resistance heating. As such direct heating method (substrate itself is heated by direct transmission of the energy from the heating means to the substrate), for example, lamp heating by means of halogen lamp, xenon lamp, etc. may be included. As the method for indirect heating, there is resistance heating, by which heating can be performed by use of a heat-generating body, etc. provided at the substrate supporting member for supporting the substrate to form deposited film arranged in the space for formation of the deposited film.

By applying the CVD method to the substrate having the electron-donative surface portion and the non-electron donative surface portion co-present thereon, a single crystal of Al is formed under good selectivity only on the electron-donative substrate surface portion. The Al thus formed will have all excellent characteristics desirable for the electrode/wiring material. That is, reduction of generation probability of hillock, reduction of generation probability of alloy spike will be accomplished.

This may be considered to be due to the fact that substantially no or extremely small formation of alloy spike, etc. on account of the eutectic reaction with the subbing silicon, etc. is seen, because Al of good quality can be formed on the surface comprising a semiconductor or an electro-conductive member as the electron-donative surface, and also the Al is excellent in crystallinity. And, when employed for the electrode of a semiconductor device, an effect surpassing the concept of the Al electrode which has been contemplated in the prior art, and could not be even expected in the prior art can be obtained.

Having described above the fact that the Al deposited on an electron-donative surface, for example, within the opening with the semiconductor substrate surface exposed becomes a single crystalline structure, according to the Al-CVD method, a metal film composed mainly of Al as described below can be also selectively deposited, and its film quality also exhibits excellent characteristics.

For example, in addition to a gas of an alkylaluminum hydride and hydrogen, a gas containing Si atoms such as $SiH_4$, $Si_2H_6$, $Si_3H_8$, $Si(CH_3)_4$, $SiCl_4$, $SiH_2Cl_2$, $SiHCl_3$, or the like.

a gas containing Ti atoms such as $TiCl_4$, $TiBr_4$, $Ti(CH_3)_4$, etc., a gas containing Cu atoms such as copper bisacetylacetonate $Cu(C_5H_7O_2)$, copper bisdipivaloylmethanite $Cu(C_{11}H_{19}O_2)_2$, copper bishexafluoroacetylacetonate $Cu(C_5HF_6O_2)_2$, etc.

may be introduced in a suitable combination to form a gas mixture atmosphere, thereby forming an electrode by selective deposition of an electroconductive material such as Al—Si, Al—Ti, Al—Cu, Al—Si—Ti, Al—Si—Cu, etc.

The Al-CVD method as described above is a film forming method excellent in selectivity, and also the surface characteristic of the film formed has good surface characteristic. Hence, by application of a non-selective film forming method to the next deposition step, Al or a metal film composed mainly of Al can be also formed on the Al film selectively deposited as described above and $SiO_2$, etc. as the insulating film, whereby a suitable metal film having high useability for general purpose as the wiring of semiconductor device can be obtained.

Specific examples of such metal film include the following. There may be included combinations of Al, Al—Si, Al—Ti, Al—Cu, Al—Si—Ti, Al—Si—Cu, etc. deposited selectively with Al, Al—Si, Al—Ti, Al—Cu, Al—Si—Ti, Al—Si—Cu, etc.

As the film forming method for non-selective deposition, there are other CVD methods than the Al-CVD method as described above, the sputtering method, etc.

(Film Forming Apparatus)

Next, a suitable film forming apparatus for forming the electrode according to the present invention is described.

Figure 16:
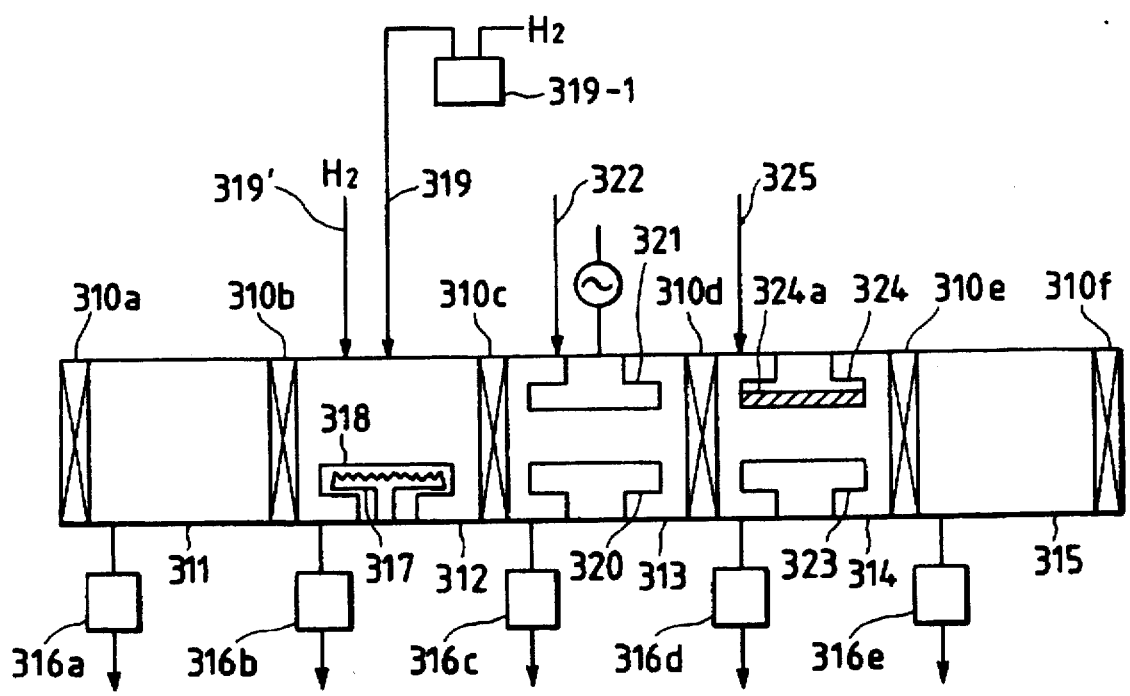
FIGS. 16 and 17 are schematic views showing an example of the film forming device to be used for practicing the film forming method suitable for formation of the wiring layer in the semiconductor device according to the present invention.
Figure 17:
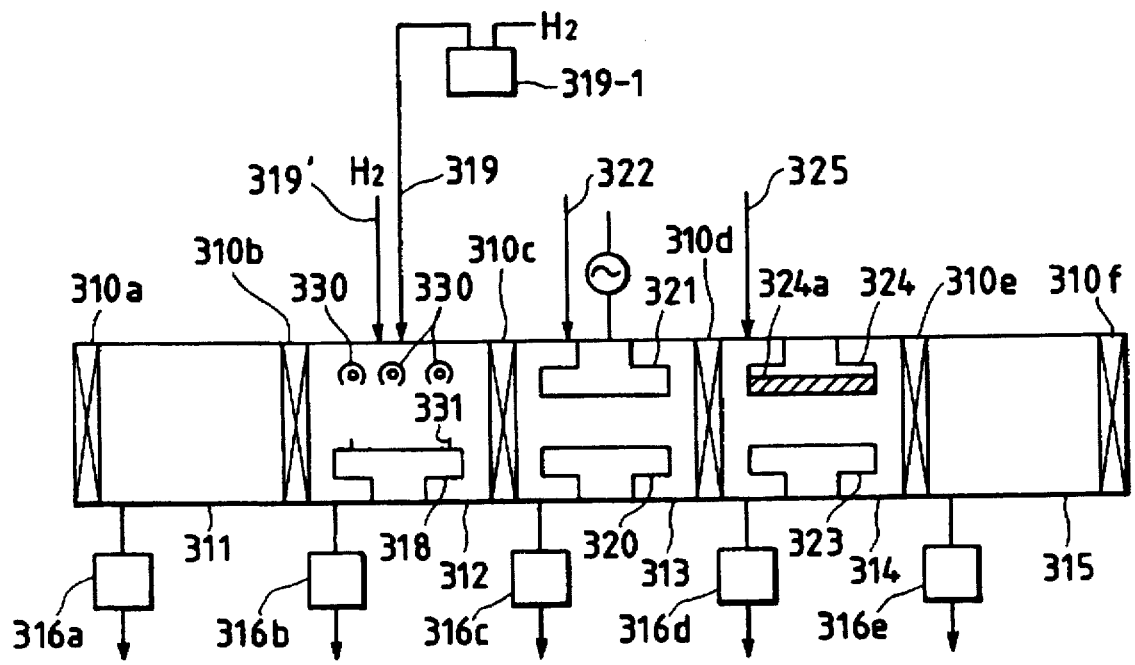
Figure 18:
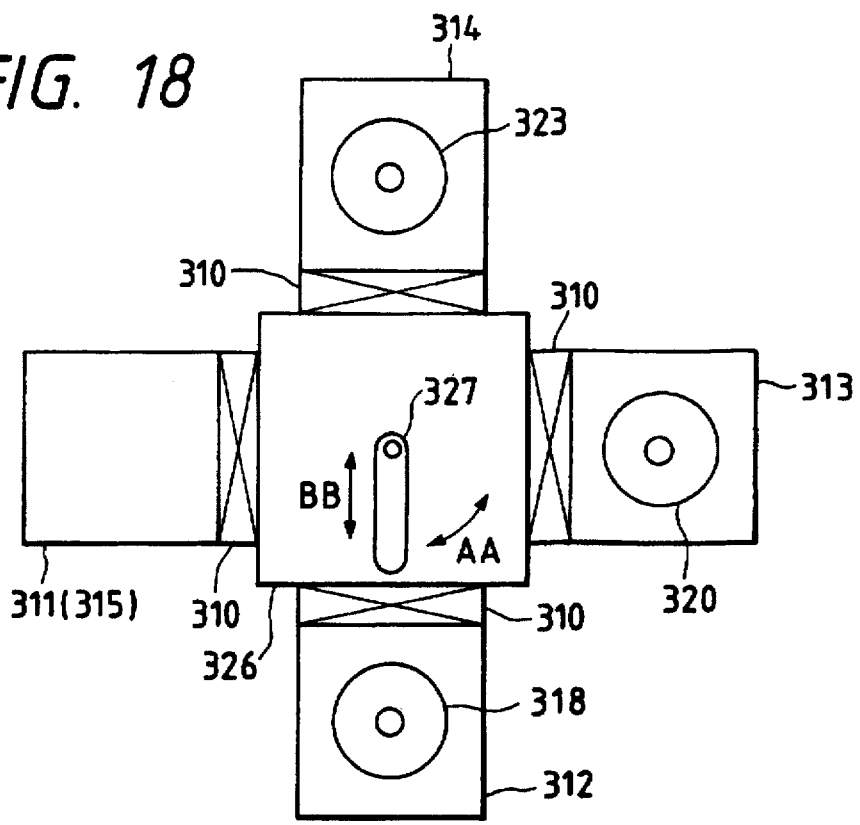
FIG. 18 is a schematic plan constitutional view of the device shown in FIGS. 16 and 17.

FIG. 16 to FIG. 18 show schematically a sequential metal film forming apparatus suitable for applying the film forming method as described above.

The sequential metal film forming apparatus, as shown in FIG. 16, is constituted of loadlock chamber 311 connected mutually communicated under shielding from outer air through the gate valves 310a to 310f, a CVD reaction chamber 312 as the first film forming chamber, an Rf etching chamber 313, a sputtering chamber 314 as the second film forming chamber and a loadlock chamber 315, and the respective chambers are constituted reducible in pressure by evacuation with the evacuation systems 316a to 316e. Here, the above loadlock chamber 311 is a chamber for replacing the substrate atmosphere before deposition treatment with $H_2$ atmosphere after evacuation in order to improve the throughput characteristic. The next CVD reaction chamber 312 is a chamber for selective deposition on the substrate according to the Al-CVD method as described above under normal pressure or reduced pressure, in which a substrate holder 318 having a heat-generating member 317 which can heat the substrate to be formed to a range of 200° C. to 450° C. is provided internally, and starting gases such as alkylaluminum hydride bubbled and gasified in the bubbler 319-1 are introduced into the chamber through the starting gas introducing line 319 for CVD, and also hydrogen gas as the reactive gas is introduced through the gasline 319'. The next Rf etching chamber 313 is a chamber for carrying out cleaning of the substrate surface after selective deposition (etching) under Ar atmosphere, and internally thereof are provided at least a substrate holder 320 capable of heating the substrate to a range of 100° C. to 250° C. and an electrode line for Rf etching 321, and also an Ar gas feeding line 322 is connected. The next sputtering chamber 314 is a chamber for depositing non-selectively a metal film by sputtering under Ar atmosphere on the substrate surface, and internally thereof are provided a substrate holder 323 heated within a range of 200° C. to 250° C. and a target electrode 324 for mounting a sputter target material 324a, and also an Ar gas feeding line 325 is connected. The final loadlock chamber 315 is a control chamber before taking out the substrate after completion of the metal film deposition into the outer air, and constituted so that the atmosphere may be replaced with $N_2$.

FIG. 17 shows another constitutional example of a sequential metal film forming apparatus suitable for applying the film forming method as described above, and the same portions as described above in FIG. 16 are made the same symbols. The difference of the apparatus in FIG. 17 from that in FIG. 16 resides in that a halogen lamp 330 is provided as the direct heating means and the substrate surface can be directly heated, and for that purpose, the substrate holder 312 is provided with a nail 331 for holding the substrate under suspended state.

By directly heating the substrate surface with such constitution, the deposition speed can be further improved as described above.

Figure 19:
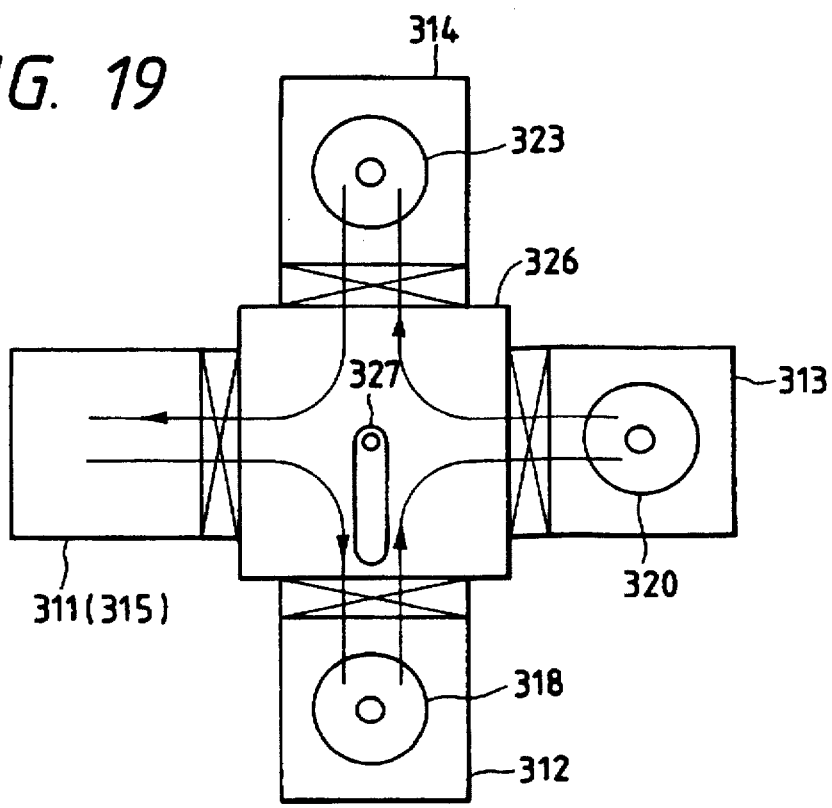
FIG. 19 is a schematic constitutional view with the movement order shown by arrowheads in FIG. 18.

The sequential metal film forming apparatus with the above constitution, as shown in FIG. 18, is substantially equivalent to one with the structure having the above loadlock chamber 311, the CVD reaction chamber 312, the Rf etching chamber 313, the sputtering chamber 314, the loadlock chamber 315 connected mutually to one another with the conveying chamber 326 as the relay chamber. With this constitution, the loadlock chamber 311 functions also as the loadlock chamber 315. In the above conveying chamber 326, as shown in the Figure, an arm 327 as the conveying means reversibly rotatable in the AA direction and stretchable in the BB direction is provided, and with the arm 327, as shown in the arrowhead in FIG. 19, the substrate can be moved following the steps successively from the loadlock chamber 311 to the CVD chamber 312, the Rf etching chamber 313, the sputtering chamber 314, the loadlock chamber 315 without exposure to outer air.

(Film Forming Procedure)

The film forming procedure for forming the electrode and wiring according to the present invention is described.

FIG. 20 is a schematic perspective view for illustration of the film forming procedure for formation of the electrode and wiring according to the present invention.

First, the outline is described. A semiconductor substrate having openings formed on an insulating film is prepared, which substrate is arranged in a film forming chamber, and its surface is maintained at, for example, 260° C. to 450° C. to deposit selectively Al at the portion where the semiconductor is exposed according to the hot CVD method in a mixed atmosphere of DMAH as the alkylaluminum hydride and hydrogen gas. Of course, as described above, a metal film composed mainly of Al such as Al—Si, etc. may be also deposited selectively by introducing a gas containing Si atoms, etc. Next, on the Al selectively deposited by the sputtering method and the insulating film, Al or a metal film composed mainly of Al is non-selectively formed. Then, by patterning of the metal film non-selectively deposited to a desired wiring shape, electrodes and wirings can be formed.

Referring next to FIG. 17 to FIG. 20, description is made in more detail. First, a substrate is prepared. As the substrate, for example, a single crystalline Si wafer having an insulating film provided with openings with respective apertures provided thereon is prepared.

Figure 20A:
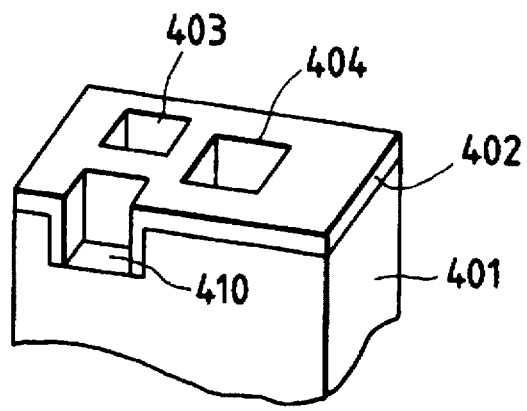
FIGS. 20A to 20D are schematic views for illustration of the film forming method suitable for formation of the wiring layer in the semiconductor device according to the present invention.

FIG. 20A is a schematic view showing a part of the substrate. Here, 401 is a single crystalline silicon substrate as a conductive substrate, 402 a thermally oxidized silicon film as the insulating film (layer). 403 and 404 are openings (exposed portions), having apertures different from each other. 410 is the groove bottom with Si exposed.

The procedure for forming Al film which becomes the electrode as the first wiring layer on the substrate is as follows with FIG. 20.

First, the substrate as described above is arranged in the loadlock chamber 311. Hydrogen is introduced into the loadlock chamber 311 to make it under hydrogen atmosphere. And, the reaction chamber 312 is internally evacuated to approximately $1 \times 10^{-8}$ Torr by the evacuation system 316b. However, Al film can be formed even if the vacuum degree within the reaction chamber 312 may be worse than $1\times10^{-8}$ Torr.

And, the gas of DMAH bubbled from the gas line 319 is fed. For the carrier gas for the DMAH line, $H_2$ is employed.

The second gas line 319' is for $H_2$ as the reaction gas, and by flowing $H_2$ through the second gas line 319' and controlling the opening degree of the slow leak valve not shown to adjust the pressure within the reaction chamber 312 to a predetermined value. A typical pressure in this case is preferably about 1.5 Torr. Through the DMAH line, DMAH is introduced into the reaction tube. The total pressure is made about 1.5 Torr, and the DMAH pressure $5.0\times10^{-3}$ Torr. Then, current is passed to the halogen lamp 330 to directly heating the wafer. Thus, Al is selectively deposited.

After elapse of a predetermined deposition time, feeding of DMAH is once stopped. The predetermined deposition time of the Al film deposited in this process is the time until the thickness of the Al film on the Si (single crystalline silicon substrate 1) becomes equal to the film thickness of the $SiO_2$ (thermally oxidized silicon film 2), and can be determined previously by experimentation.

Figure 20B:
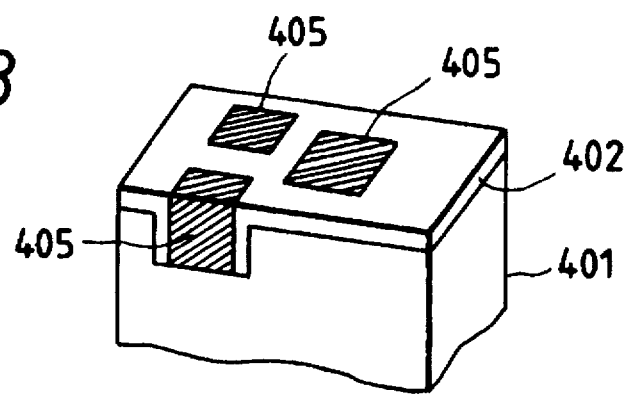
Figure 20C:
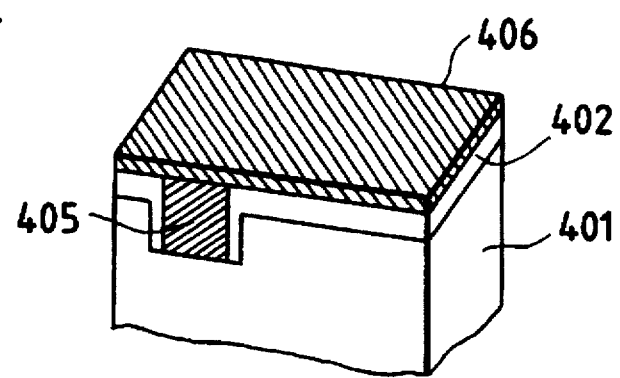

The temperature of the substrate surface by direct heating at this time is made about 270° C. According to the steps up to this stage, the Al film 405 is selectively deposited within the openings and the grooves as shown in FIG. 20B.

All of the steps as described above are referred to as the first film forming step for formation of electrode within contact hole.

After the above first film forming step, the CVD reaction chamber 312 is evacuated until reaching a vacuum degree of $5\times10^{-3}$ Torr or lower by the evacuation system 316b. At the same time, the Rf etching chamber 313 is evacuated to $5\times10^{-6}$ Torr or lower. After confirmation that the both chambers have reached the above vacuum degree, the gate valve 310c is opened, the substrate moved from the CVD reaction chamber 312 to the Rf etching chamber 313 by the conveying means, and the gate valve 310c closed. The substrate is conveyed to the Rf etching chamber 313, and the Rf etching chamber 313 is evacuated by means of the evacuation system 316c until reaching a vacuum degree of $10^{-6}$ Torr or lower. Then, argon is fed through the argon feeding line 322 for Rf etching, and the Rf etching chamber 131 maintained under an argon atmosphere of $10^{-1}$ to $10^{-3}$ Torr. The substrate holder 320 of Rf etching is maintained at about 200° C., Rf power of 100 W supplied to the electrode for Rf etching 321 for about 60 seconds, and discharging of argon is caused to occur within the Rf etching chamber 313 for about 60 seconds. By doing so, the surface of the substrate can be etched with argon ions to remove unnecessary surface layer of the CVD deposited film. The etching depth in this case is made about 100 Å in terms of the oxide. Here, surface etching of the CVD deposited film is effected in the Rf etching chamber, but since the surface layer of the CVD film of the substrate conveyed through vacuum contains no oxygen, etc., no Rf etching may be effected. In that case, the Rf etching chamber 313 function as the temperature changing chamber for effecting temperature change within a short time, when the temperatures in the CVD reaction chamber 12 and the sputtering chamber 314 are greatly different.

In the Rf etching chamber 313, after completion of Rf etching, flowing of argon is stopped, and the argon within the Rf etching chamber 313 is evacuated. After the Rf etching chamber 313 is evacuated to $5\times10^{-6}$ Torr and the sputtering chamber 314 to $5\times10^{-6}$ Torr or lower, the gate valve 310d is opened. Then, the substrate is moved from the Rf etching chamber 313 to the sputtering chamber 314 by means of a conveying means, followed by closing of the gate valve 310d.

After the substrate is conveyed to the sputtering chamber 314, the sputtering chamber 314 is made under an argon atmosphere of $10^{-1}$ to $10^{-3}$ Torr similarly as in the Rf etching chamber 313, and the temperature of the substrate holder 323 for mounting the substrate set to about 200° to 250° C. And discharging of argon is effected at a DC power of 5 to 10 KW to cut a target material such as Al or Al—Si (Si: 0.5%) and effect film formation of a metal such as Al, Al—Si, etc. at a deposition speed of about 10000 Å/min. on the substrate. This step is a non-selective deposition step. This is called the second film forming step for formation of the wiring to be connected to the electrode.

After formation of a metal film of about 5000 Å, flowing of argon and application of DC power are stopped. After evacuation of the loadlock chamber 311 to $5\times10^{-3}$ Torr or lower, the gate valve 310e is opened and the substrate moved. After the gate valve 310e is closed, $N_2$ gas is permitted to flow into the loadlock chamber 311 until reaching atmospheric pressure, the gate valve 310f opened and the substrate taken out of the apparatus.

According to the second Al film deposition step as described above, the Al film 406 can be formed on the $SiO_2$ film 402.

Figure 20D:
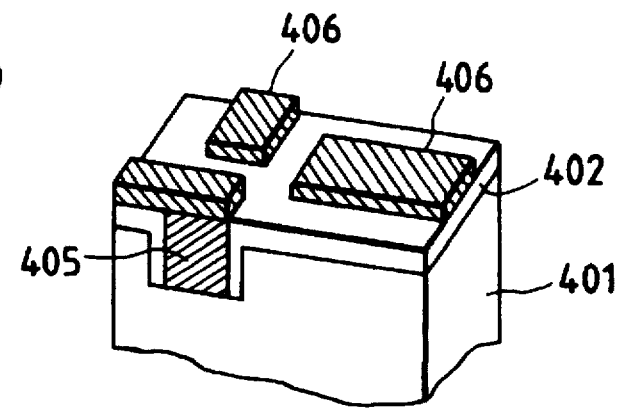

And, by patterning the Al film 406 as shown in FIG. 20D, a wiring with a desired shape can be obtained.

(Experimental Examples)

In the following, how excellent is the above-described Al-CVD method is and how good of the quality the Al film deposited within the openings is are described based on the experimental results.

First, as the substrate, a plurality of N-type single crystalline silicon wafers were prepared, which are thermally oxidized on the surface to form $SiO_2$ of 8000 Å, and have various openings with various apertures from 0.25 μm×0.25 μm square to 100 μm×100 μm square patterned to have the subbing Si single crystal exposed (Sample 1-1).

These are subjected to formation of Al films according to the Al-CVD method under the conditions as described below. Under the common conditions by use of DMAH as the starting gas, and hydrogen as the reaction gas, a total pressure of 1.5 Torr, a DMAH partial pressure of $5.0\times10^{-3}$ Torr, the power amount passed through the halogen lamp is adjusted and the substrate surface temperature set within the range of 200° C. to 490° C. to form films.

The results are shown in Table 1.

TABLE 1

| Substrate surface temperature (°C.) | 200 | 230 | 250 | 260 | 270 | 280 | 300 | 350 | 400 | 440 | 450 | 460 | 470 | 480 | 490 |
|---|---|---|---|---|---|---|---|---|---|---|---|---|---|---|---|
| Deposition speed (Å/min) | ← 1000–1500 → | | | ← 3000–5000 → | | | | | | | | | | | |
| Line defect of Si | ← Not recognized → | | | | | | | | | | | | | | |
| Carbon content | ← Not detected → | | | | | | | | | | | | | | |
| Resistivity (Ω μ cm) | ← 2.7–3.3 → | | | ← 2.8–3.4 → | | | | | | | | | | | |
| Reflectance (%) | ← 85–95 → | | | | ← 90–95 → | | | | | ← 60 → | | | | | |
| Hillock density of 1 μm or more | ← 1–10² → | | | ← 0–10 → | | | | | | ← 10–10⁴ → | | | | | |
| Spike generation (destruction probability of 0.15 μm junction) | ← 0 → | | | | | | | | | | ← 0–30 → | | | | |

As can be seen from Table 1, at a substrate surface temperature by direct heating of 260° C. or higher, Al is deposited selectively at a high deposition speed of 3000 to 5000 Å/min. within the openings.

When the characteristics of the Al film within the openings at substrate surface temperature range of 260° C. to 440° C. are examined, they are found to be excellent such that no carbon is contained, with resistivity being 2.8 to 3.4 μΩcm, reflectance 90 to 95%, hillock density of 1 μm or higher 0 to 10 and substantially no spike generation (destruction probability of 0.15 μm junction).

In contrast, at substrate surface temperatures of 200° C. to 250° C., the film is found to be considerably good as compared with the prior art although the film quality is slightly worse as compared with the case of 260° C. to 440° C., but the deposition speed is 1000 to 1500 Å/min., which can never be said to be sufficiently high.

When the substrate surface temperature becomes 450° C. or higher, the characteristics of the Al film with the openings are lowered with the reflectance becoming 60% or less, hillock density of 1 μm or more 10 to 10⁴ cm⁻², alloy spike generation 0 to 30%.

Next, description is made about how suitably the method as described above can be used for openings such as contact hole or thru-hole.

That is, it can be also preferably applied to the contact hole/thru-hole structure comprising the material as described below.

On the Sample 1-1 as described above, an Al film is formed on a substrate (sample) as described below under the same conditions as when the Al film is formed.

On a single crystalline silicon as the first substrate surface material is formed a silicon oxide film according to the CVD method as the second substrate surface material, and patterning effected according to the photolithographic steps to have the single crystalline silicon surface partially exposed.

The film thickness of the thermally oxidized SiO₂ film has a film thickness of 8000 Å, the exposed portion of the single crystalline silicon a size of 0.25 μm×0.25 μm to 100 μm×100 μm. Thus, Sample 1-2 is prepared (hereinafter such samples are represented as "CVD SiO₂ (hereinafter abbreviated as SiO₂)/single crystalline silicon").

Sample 1-3 is boron doped oxide film formed by normal pressure CVD (hereinafter abbreviated as BSG)/single crystalline silicon, Sample 1-4 phosphorus doped oxide film formed by normal pressure CVD (hereinafter abbreviated as PSG)/single crystalline silicon, Sample 1-5 phosphorus and boron doped oxide film formed by normal pressure CVD (hereinafter abbreviated as BSPG)/single crystalline silicon, Sample 1-6 nitride film formed by plasma CVD (hereinafter abbreviates as P-SIN)/single crystalline silicon, Sample 1-7 hot nitride film (hereinafter abbreviated as T-SiN)/single crystalline silicon, Sample 1-8 nitride film formed by low pressure CVD (hereinafter abbreviated as LP-SiN)/single crystalline silicon, Sample 1-9 nitride film formed by means of an ECR apparatus (hereinafter abbreviated as ECR-SiN)/single crystalline silicon.

Further, according to all combinations of the first substrate surface materials (18 kinds) and the second substrate surface materials (9 kinds), Samples 1-11 to 1-179 (note: Sample Nos. 1-10, 20, 30, 40, 50, 60, 70, 80, 90, 100, 110, 120, 130, 140, 150, 160, 170 are lacking) are prepared. As the first substrate surface material, single crystalline silicion (single crystalline Si), polycrystalline silicon (polycrystalline Si), amorphous silicon (amorphous Si), tungsten (W), molybdenum (Mo), tantalum (Ta), tungsten silicide (WSi), titanium silicide (TiSi), aluminum (Al), aluminum silicon (Al—Si), titanium aluminum (Al—Ti), titanium nitride (Ti—N), copper (Cu), aluminum silicon copper (Al—Si—Cu), aluminum palladium (Al—Pd), titanium (Ti), molybdenum silicide (Mo—Si), tantalum silicide (Ta—Si) are employed. As the second substrate surface material, T—SiO₂, SiO₂, BSG, PSG, BPSG, P—SiN, T—SiN, LP—SiN, ECR-SiN are employed. For all of the samples as described above, good Al films comparable with the Sample 1-1 could be formed.

Next, on the substrate having Al deposited selectively as described above, Al is deposited non-selectively according to the sputtering method as described above, followed by patterning.

As the result, the Al film formed according to the sputtering method, and the Al film selectively selected within the openings are found to be under the contact state with both electrically and mechanically high durability due to good surface characteristic of the Al film.

(Experimental Examples)

Trial samples of semiconductor device are made according to the methods as described in Examples 1 to 8, and as the result of experimentation, good characteristics as expected can be obtained.

What is claimed is:

1. A method for producing a semiconductor integrated circuit device wherein plural semiconductor elements are found in a common semiconductor substrate of a first conductivity type and a separation region for separating said plural semiconductor elements, said method comprising the steps of:

forming a separation region having a groove comprising a bottom section of a semiconductor of a second conductivity type opposite to the first conductivity type and a side wall of an insulator;

forming a metal made of aluminum by selectively depositing aluminum within said groove by means of a CVD process using alkylaluminumhydride and burying said metal within said groove;

forming a contact hole in an insulating film provided on one of said semiconductor elements;

simultaneously deposting a conducting material in said contact hole and on said aluminum within said groove; and electrically connection said deposited conducting material in said contact hole and on said aluminum within said groove with a wiring layer.

2. A method according to claim 1, wherein the alkylaluminumhydride is dimethylaluminumhydride.

3. A method according to claim 1, wherein said conductor is produced by CVD process using an alkylaluminumhydride.

4. A method according to claim 1, wherein said conductor is deposited selectively with in the contact hole.

5. A method according to claim 1, wherein said conductor is produced by CVD process using dimethylaluminumhydride.

6. A method according to claim 4, wherein said conductor is produced by CVD process using dimethylaluminumhydride.

* * * * *

UNITED STATES PATENT AND TRADEMARK OFFICE
CERTIFICATE OF CORRECTION

PATENT NO. : 5,665,630

DATED : September 9, 1997

INVENTOR(S) : KEIJI ISHIZUKA, ET AL.        Page 1 of 4

It is certified that error appears in the above-identified patent and that said Letters Patent is hereby corrected as shown below:

COLUMN 1

Line 27, "wiring 1 or 6"" should read --wiring 1--; and
    Line 38, "build-in" should read --built-in--.

COLUMN 2

Line 41, "are" should read --is--;
    Line 52, "second wiring layer 55 for" should be deleted;
    Line 53, "connecting the" should be deleted; and
    Line 63, "shown" should read --shown in--.

COLUMN 3

Line 2, "lamination" should read --laminations--;
    Line 66, "provide" should read --provide a--; and
    Line 67, "removed" should read --removes--.

COLUMN 5

Line 23, "deposition" should read --depositing--;
    Line 31, "for functional lowering due to mutual" should read --in function due to lowering of mutual--; and
    Line 37, "an" should read --and--.

COLUMN 6

Line 35, "devices" should read --device--; and
    Line 37, "FIG. 6" should read --Figs. 6A and 6B--.

UNITED STATES PATENT AND TRADEMARK OFFICE
CERTIFICATE OF CORRECTION

PATENT NO. : 5,665,630

DATED : September 9, 1997

INVENTOR(S) : KEIJI ISHIZUKA, ET AL.

Page 2 of 4

It is certified that error appears in the above-identified patent and that said Letters Patent is hereby corrected as shown below:

COLUMN 7

Line 1, "FIG. 6" should read --Figs. 6A and 6B--;
Line 11, "according to photolithography by use of a resist," should read --via photolithography using a resist,--;
Line 12, "to be" should read --is--;
Line 31, "FIG. 6" should read --Figs. 6A and 6B--;
Line 36, "through of" should read --through--; and
Line 62, "electrical" should read --electrical field--.

COLUMN 8

Line 18-21, "$n^+$" should read --is $n^+$--;
Line 29, "opening" should read --openings--; and
Line 62, "opening" should read --openings-- and "internally" should read --internally in--.

COLUMN 9

Line 44-45, "FIG. 6" should read --Figs. 6A and 6B--; and
Line 52, "differs" should read --which differs--.

COLUMN 10

Line 10, "Therefore, the" should read --The--;
Line 13, "in difference from the former" should read --of the latter--; and
Line 17, "and" should read --and on--.

UNITED STATES PATENT AND TRADEMARK OFFICE
CERTIFICATE OF CORRECTION

PATENT NO. : 5,665,630

DATED : September 9, 1997

INVENTOR(S) : KEIJI ISHIZUKA, ET AL.

It is certified that error appears in the above-identified patent and that said Letters Patent is hereby corrected as shown below:

COLUMN 11

Line 9, "upper" should read --upper surface--;
Line 15, "N+" should read --$N^+$--; and
Line 52, "above," should read --above, is doped--.

COLUMN 13

Line 16, "method" should read --metal--.

COLUMN 14

Line 56, "like." should read --like,--.

COLUMN 15

Line 26, "connected" should read --connected and--.

COLUMN 17

Line 7, "by" should read --for--;
Line 15, "heating" should read --heat--; and
Line 57, "function" should read --functions--.

COLUMN 18

Line 39, "is" should be deleted; and
Line 40, "of" should be deleted.

UNITED STATES PATENT AND TRADEMARK OFFICE
CERTIFICATE OF CORRECTION

PATENT NO. : 5,665,630

DATED : September 9, 1997

INVENTOR(S) : KEIJI ISHIZUKA, ET AL.

It is certified that error appears in the above-identified patent and that said Letters Patent is hereby corrected as shown below:

COLUMN 19

Line 60, "formed" should read --formed as--.

COLUMN 20

Line 40, "abbreviates" should read --abbreviated--.

COLUMN 22

Line 5, "deposting" should read --depositing--;
　　　Line 9, "connection" should read --connecting--; and
　　　Line 19, "with in" should read --within--.

Signed and Sealed this

Twenty-fifth Day of August, 1998

Attest:

BRUCE LEHMAN

*Attesting Officer*　　　*Commissioner of Patents and Trademarks*